(12) United States Patent
Kim et al.

(10) Patent No.: US 9,119,304 B2
(45) Date of Patent: Aug. 25, 2015

(54) LIGHT EMITTING DEVICE INCLUDING A LIGHT EMITTING ELEMENT MOUNTED ON A SUB-MOUNT

(75) Inventors: Yu-Sik Kim, Anyang-si (KR); Woo-Sung Han, Seoul (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 270 days.

(21) Appl. No.: 13/566,291

(22) Filed: Aug. 3, 2012

(65) Prior Publication Data

US 2013/0001606 A1 Jan. 3, 2013

Related U.S. Application Data

(63) Continuation of application No. 12/457,803, filed on Jun. 22, 2009, now Pat. No. 8,238,112.

(30) Foreign Application Priority Data

Jun. 24, 2008 (KR) .................. 10-2008-0059567

(51) Int. Cl.
*H05K 1/11* (2006.01)
*H05K 1/14* (2006.01)
(Continued)

(52) U.S. Cl.
CPC .......... *H05K 1/0295* (2013.01); *H01L 25/0753* (2013.01); *H01L 2224/16225* (2013.01); *H05K 2201/0949* (2013.01); *H05K 2201/09227* (2013.01); *H05K 2201/09254* (2013.01); *H05K 2201/09318* (2013.01); *H05K 2201/09663* (2013.01); *H05K 2201/09954* (2013.01);
(Continued)

(58) Field of Classification Search
USPC ............ 361/782–784, 760–764, 803; 257/13, 257/88–98
See application file for complete search history.

(56) References Cited

U.S. PATENT DOCUMENTS 5,959,316 A * 9/1999 Lowery ........................... 257/98
6,066,861 A * 5/2000 Hohn et al. ..................... 257/99
(Continued)

FOREIGN PATENT DOCUMENTS

| JP | 2007-048773 A | 2/2007 |
| JP | 2007-116116 A | 5/2007 |

(Continued)

OTHER PUBLICATIONS

Taiwan Office Action dated Mar. 24, 2014.
(Continued)

*Primary Examiner* — Tuan T Dinh
(74) *Attorney, Agent, or Firm* — Lee & Morse, P.C.

(57) ABSTRACT

A sub-mount adapted for AC and DC operation of devices mountable thereon, light emitting devices including such a sub-mount, and methods of manufacturing such a sub-mount are provided. The sub-mount includes a base substrate having first and second surfaces, a conductive pattern on the first surface, first and second pairs of first and second electrodes on the second surface and vias extending through the base substrate between the first and second surfaces. The conductive pattern includes a first set of mounting portions and two via portions along a first electrical path between the first pair of first and second electrodes, and a second set of mounting portions and two via portions along a second electrical path between the second pair of first and second electrodes, the via portions connecting respective portions of the conductive pattern to respective electrodes.

9 Claims, 26 Drawing Sheets

(51) Int. Cl.
*H05K 1/02* (2006.01)
*H01L 25/075* (2006.01)

(52) U.S. Cl.
CPC *H05K2201/10106* (2013.01); *H05K 2203/173* (2013.01)

(56) References Cited

U.S. PATENT DOCUMENTS

| | | | |
|---|---|---|---|
| 7,148,515 | B1 | 12/2006 | Huang et al. |
| 7,567,317 | B2 | 7/2009 | Tanaka et al. |
| 8,154,040 | B2 | 4/2012 | Sorg et al. |
| 2002/0075677 | A1 | 6/2002 | Dokoupil |
| 2003/0030060 | A1 | 2/2003 | Okazaki |
| 2004/0012027 | A1* | 1/2004 | Keller et al. ............. 257/79 |
| 2006/0012299 | A1* | 1/2006 | Suehiro et al. ............ 313/512 |
| 2006/0158130 | A1 | 7/2006 | Furukawa |
| 2007/0085944 | A1 | 4/2007 | Tanaka et al. |
| 2008/0036362 | A1* | 2/2008 | Tanimoto et al. ............ 313/498 |
| 2010/0012955 | A1 | 1/2010 | Sorg et al. |
| 2010/0230691 | A1 | 9/2010 | Inoue et al. |
| 2012/0190140 | A1 | 7/2012 | Sorg et al. |

FOREIGN PATENT DOCUMENTS

| | | |
|---|---|---|
| JP | 2007-140453 A | 6/2007 |
| JP | 2007-262154 A | 11/2007 |
| KR | 10-2005-0060479 A | 6/2005 |
| KR | 10-0652133 B1 | 11/2006 |
| TW | 200527722 | 12/1993 |
| TW | 200816530 | 9/1996 |

OTHER PUBLICATIONS

Korean Office action dated May 23, 2014 for KR 10-2008-0059567 (Kim, et al.).

Chinese Office Action for 201210396187.2 dated Jun. 9, 2015; Kim, et al.

* cited by examiner

LIGHT EMITTING DEVICE INCLUDING A LIGHT EMITTING ELEMENT MOUNTED ON A SUB-MOUNT

CROSS REFERENCE TO RELATED APPLICATION

This is a continuation application based on pending application Ser. No. 12/457,803, filed Jun. 22, 2009, the entire contents of which is hereby incorporated by reference.

BACKGROUND

1. Field

Embodiments relate to sub-mounts, light emitting elements, light emitting devices including such light emitting elements on a sub-mount, and methods of manufacturing such sub-mounts and/or light emitting devices. More particularly, embodiments relate to sub-mounts and light emitting devices employing sub-mounts that are optimized for both alternating current (AC) and direct current (DC) operation.

2. Description of the Related Art

Light emitting elements, e.g., light emitting diodes (LEDs), are employed in a variety of applications, e.g., displays, digital clocks, remote controls, watches, calculators, cell phones, indicator lights, backlights, etc. More particularly, e.g., light emitting diodes may be employed as a liquid crystal display (LCD) backlight unit, a camera flash, display screen, etc.

LEDs generally emit light as a result of electroluminescence, i.e., recombination of electron-hole pairs. Electron-hole pairs may be recombined as a result of electric current at a semiconductor p-n junction. When electrons and holes recombine, energy may be given off in the form of photons.

In general, a light emitting element, e.g., LEDs, may be packaged as a single chip. A plurality of such single chip LEDs may be connected in series or in parallel in an apparatus, e.g., a light source. More particularly, the plurality of LEDs may be mounted on a substrate.

While such LEDs are already being used in a wide variety of applications, there is a need for sub-mounts and/or light emitting devices including sub-mounts that are optimized for both AC and DC operation of the LEDs.

SUMMARY

Embodiments are therefore directed to sub-mounts and light emitting devices employing sub-mounts, which substantially overcome one or more of the problems due to the limitations and disadvantages of the related art.

It is therefore a feature of an embodiment to provide sub-mounts that are optimized for both alternating current (AC) and direct current (DC) operation of elements mounted thereon.

It is therefore a separate feature of an embodiment to provide light emitting devices including a sub-mount, which are optimized for both alternating current (AC) and direct current (DC) of elements mounted thereon.

It is therefore a separate feature of an embodiment to provide a method of fabricating a sub-mount that is optimized for both alternating current (AC) and direct current (DC) operation.

It is therefore a separate feature of an embodiment to provide a method of fabricating a light emitting device including a sub-mount, which is optimized for both alternating current (AC) and direct current (DC) operation.

At least one of the above and other features and advantages may be realized by providing a sub-mount adapted for AC and DC operation of devices mountable thereon, the sub-mount including a base substrate including a first surface and a second surface, the first surface being different from the second surface, a conductive pattern on the first surface, a first pair of first and second electrodes on the second surface of the base substrate, a second pair of first and second electrodes on the second surface of the base substrate, and a plurality of vias extending through the base substrate between the first surface and the second surface, wherein the conductive pattern includes a first set of mounting portions and two via portions along a first electrical path between the first pair of first and second electrodes, and a second set of mounting portions and two via portions along a second electrical path between the second pair of first and second electrodes, the first path being independent of the second path, and each of the via portions connecting respective portions of the conductive pattern to a respective one of the electrodes of the first and second pair of first and second electrodes through a respective one of the vias.

The conductive pattern may further include wiring portions adapted to connect respective mounting portions together.

Each of the mounting portions may include a mounting sub-portion and a connecting sub-portion.

At least some of the mounting portions may include a substantially Y-like shape with the mounting sub-portions having a substantially V-like shape and the connecting sub-portions extending toward the mounting sub-portion of an adjacent one of the mounting portions along the respective electrical path.

Each of the mounting sub-portions may correspond to a mounting region of the sub-mount, each of the mounting regions 1 being adapted to mount a light emitting device thereon.

Each of the connecting sub-portions may be associated with two of the mounting regions.

The mounting sub-portions may be arranged in a matrix pattern.

The connecting sub-portions may extend diagonally between adjacent ones of the mounting sub-portions.

The first electrical path may flow from one of the first and second electrodes of the first pair of electrodes through the a first via of the plurality of vias, a first via portion of the corresponding two via portions, the first set the mounting portions, a second via portion of the corresponding two via portions, a second via of the plurality of vias and the other of the first and second electrodes of the first pair of electrodes, and the second electrical path may flow from one of the first and second electrodes of the second pair of electrodes through a third via of the plurality of vias, a via portion of the corresponding two via portions, the second set of mounting portions, a second via portion of the corresponding two via portions, a fourth via of the plurality of vias, and the other of the first and second electrodes of the second pair of electrodes.

The first and second pair of first and second electrodes may be arranged in a matrix pattern on the second surface, and the first pair of first and second electrodes is arranged diagonally along a first direction and the second pair of first electrodes is arranged diagonally along a second direction.

Each of the mounting portions may include three mounting sub-portions arranged adjacent to each other, each of the mounting sub-portions being spaced apart from each other.

Each of the mounting sub-portions may include an E-like and/or an inverse E-like shaped portion.

Each of the mounting portions may correspond to four mounting regions of the sub-mount, each of the mounting regions may be adapted to mounting a light emitting device thereon.

The mounting portions may be arranged in a matrix pattern.

At least one of the above and other features and advantages may be separately realized by providing a light emitting device, including at least one sub-mount including a base substrate, a first pair of first and second electrodes, a second pair of first and second electrodes, a conductive pattern and a plurality of vias, a first set of light emitting devices mounted on the sub-mount, the first set of light emitting devices being connected between the first pair of first and second electrodes of the sub-mount, a second set of light emitting devices mounted on the sub-mount, the second set of light emitting devices being connected between the second pair of first and second electrodes of the sub-mount, a first power supply electrode connected to one of the first and second electrodes of the first pair of electrodes and one of the first and second electrodes of the second pair of electrodes on the sub-mount, and a second power supply electrode connected to the other of the first and second electrodes of the first pair of electrodes and the other of the first and second electrodes of the second pair of electrodes on the sub-mount, wherein the sub-mount is adapted for AC and DC operation of the light emitting devices based on which one of the first and second electrodes of each pair of electrodes is connected to the to the first power supply electrode and the second power supply electrode.

The light emitting devices of each of the first and second sets of light emitting devices may be arranged in series and/or in parallel with each other.

The first and second sets of light emitting devices may be mounted on the sub-mounts in a matrix pattern.

The light emitting device may further include a plurality of the sub-mounts, and a circuit substrate including a plurality of connecting patterns, the first power supply electrode and the second power supply electrode arranged thereon, wherein the connecting patterns may be adapted to electrically connect a plurality of the sub-mounts along an electrical path between the first power supply electrode and the second power supply electrode.

The light emitting device may include a substrate on which the first power supply electrode and the second power supply electrode are arranged, wherein a plurality of the sub-mounts are arranged on the substrate such that, for each of the sub-mounts, one of the first and second electrodes of the first electrode pair is connected to the first power supply electrode and the other of the first and second electrodes of the second electrode pair is connected to the second power supply electrode, and one of the first and second electrodes of the second electrode pair is connected to the second power supply electrode and the other of the first and second electrodes of the second electrode pair is connected to the second power supply electrode.

The first power supply electrode and the second power supply electrode may extend parallel to each other on the substrate.

Each of the light emitting devices of the first set and the second set of light emitting devices may be a light emitting diode.

At least one of the above and other features and advantages may be separately realized by providing a sub-mount employable for electrically connecting a plurality of light emitting devices in series and/or in parallel on a mounting substrate, the sub-mount including a base substrate, a conductive pattern on the base substrate, a first pair of first and second electrodes on the base substrate, a second pair of first and second electrodes on the base substrate, and a plurality of vias extending through the base substrate, wherein the conductive pattern includes a first set of mounting portions defining a first electrical path between the first pair of first and second electrodes through first and second ones of the plurality of vias, and a second set of mounting portions defining a second electrical path between the second pair of first and second electrodes through third and fourth ones of the plurality of vias, the first path being independent of the second path, when the sub-mount is arranged in a first orientation on the mounting substrate, the plurality of light emitting devices mountable on the first set of mounting portions and the plurality of light emitting devices mountable on the second set of mounting portions thereon are electrically connected such that current flows through the first set of light emitting devices and the second set of light emitting devices in a forward bias direction, and when the sub-mount is arranged in a second orientation on the mounting substrate, the plurality of light emitting devices mountable on the first set of mounting portions and the plurality of light emitting devices mountable on the second set of mounting portions thereon are electrically connected such that current flows through the first set of light emitting devices in a forward bias direction and current flows through the second set of light emitting devices in a reverse bias direction, the first orientation being different from the second orientation.

The first orientation may be rotated 90 degrees relative to the second orientation.

At least one of the above and other features and advantages may be separately realized by providing a method of manufacturing a sub-mount adapted for AC and DC operation of devices mountable thereon, the method including forming a plurality of vias in a base substrate, forming a conductive pattern on a first surface of the base substrate, forming a first pair of first and second electrodes on a second surface of the base substrate, forming a second pair of first and second electrodes on the second surface of the base substrate, wherein the vias extend through the base substrate between the first surface and the second surface, the conductive pattern includes a first set of mounting portions and two via portions along a first electrical path between the first pair of first and second electrodes, and a second set of mounting portions and two via portions along a second electrical path between the second pair of first and second electrodes, the first path being independent of the second path, and each of the via portions connecting respective portions of the conductive pattern to a respective one of the electrodes of the first and second pair of first and second electrodes through a respective one of the vias.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF EXEMPLARY EMBODIMENTS

Figure 1A:
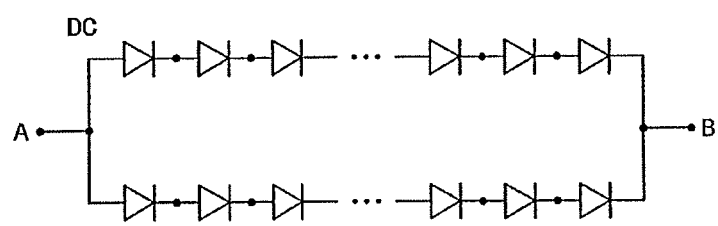
FIG. 1A illustrates a schematic diagram of a light emitting device including a plurality of light emitting diodes adapted for DC operation according to an exemplary embodiment.

Korean Patent Application No. 10-2008-0059567, filed on Jun. 24, 2008, in the Korean Intellectual Property Office, and entitled: "SUB-MOUNT, LIGHT EMITTING DEVICE USING THE SAME AND FABRICATING METHOD OF SUB-MOUNT, FABRICATION METHOD OF LIGHT EMITTING DEVICE USING THE SAME," is incorporated by reference herein in its entirety.

Embodiments of one or more aspects of the invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when an element is referred to as being "on" another element, it can be directly on the other element, or intervening elements may also be present. Further, it will be understood that when an element is referred to as being "under" another element, it may be directly under, and one or more intervening element may also be present. In addition, it will also be understood that when an element is referred to as being "between" two elements, it may be the only element between the two elements, or one or more intervening elements may also be present. Additionally, it will be understood that when an element is referred to as being "between" two elements, it may be physically arranged between facing/overlapping portions of the two elements, it may be physically arranged such that one of the elements is below it and the other element is above it, or it may be such that it is along a path of, e.g., current flow between the two elements. Like reference numerals refer to like elements throughout the specification.

Embodiments described herein provide sub-mounts employable, e.g., in light emitting devices and light emitting devices employing sub-mounts adapted to electrically connect a plurality of light emitting elements to operate under direct current (DC) and alternating current (AC) conditions.

FIG. 1A illustrates a schematic diagram of a light emitting device including a plurality of light emitting diodes adapted for DC operation according to an exemplary embodiment. Referring to FIG. 1A, during DC operation, all the LEDs along path 1 and path 2 between node A and node B may be turned on or turned off together.

Figure 1B:
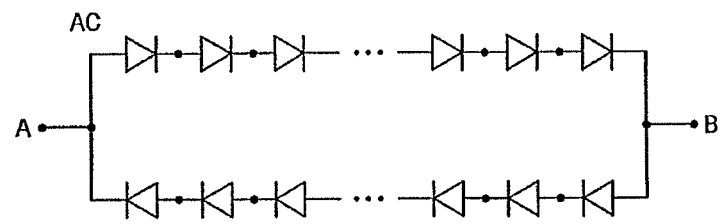
FIG. 1B illustrates a schematic diagram of a light emitting device including a plurality of light emitting diodes adapted for AC operation according to an exemplary embodiment.

FIG. 1B illustrates a schematic diagram of a light emitting device including a plurality of light emitting diodes adapted for AC operation according to an exemplary embodiment. Referring to FIG. 1B, during AC operation, the LEDs along the path 1 and the LEDs along the path 2 may be alternately turned off and on. More particularly, e.g., when the LEDs along the path 1 are turned on, the LEDs along the path 2 may be turned off, and when the LEDs along the path 1 are turned off, the LEDs along the path 2 may be turned on. In embodiments in which the LEDs are arranged in a matrix pattern within a light emitting device, e.g., a display, the LEDs may operate according to a dot inversion method, which may improve image quality of the light emitting device. Under the dot inversion method, when a respective one of the LEDs is on, corresponding ones of the other LEDs including sides facing a corresponding side of the respective LED are off. More particularly, e.g., under the dot inversion method, when a LED arranged at (1,1) is on, LEDs arranged at (1,0), (1,2), (0,1) and (2,1) are off, and when the LED arranged at (1,1) is off, LEDs arranged at (1,0), (1,2), (0,1) and (2,1) are on.

Figure 2A:
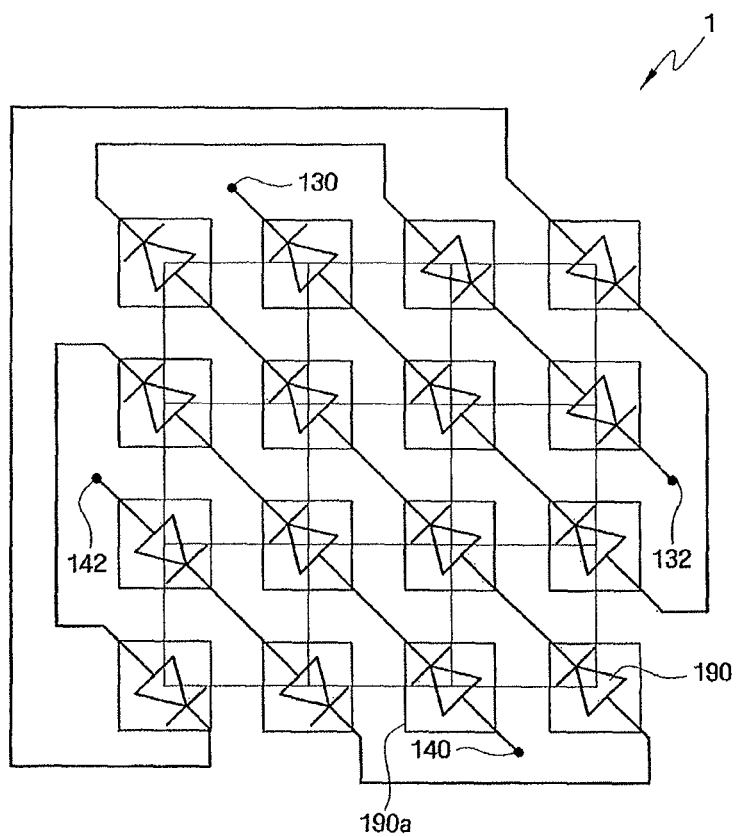
FIGS. 2A and 2B illustrate schematic diagrams of electrical paths between two pairs of electrodes of a light emitting device according to an exemplary embodiment.
Figure 2B:
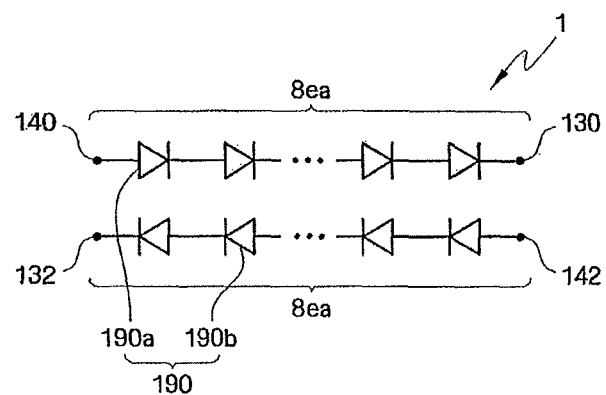

FIGS. 2A and 2B illustrate schematic diagrams of electrical paths of a light emitting device 1 adapted for AC and DC operation according to an exemplary embodiment. More particularly, in embodiments, the light emitting device 1 may include at least two pairs of electrodes adapted to enable AC and DC operation of the light emitting device 1. Referring to FIGS. 2A and 2B, the light emitting device 1 may include a plurality of LEDs 190, a first pair of electrodes 130 and 140, and a second pair of electrodes 132 and 142.

The LEDs 190 may include a first group of LEDs 190a and a second group of LEDs 190b. More particularly, the LEDs 190a between the first pair of electrodes 130 and 140 may be electrically connected together in series, and the LEDs 190b between second pair of electrodes 132 and 142 may be electrically connected together in series. In embodiments, the plurality of electrode pairs, e.g., the two pairs of electrodes 130, 140, and 132, 142 may be driven in a manner that enables the LEDs 190a, 190b of the light emitting device 1 to operate under both AC and DC conditions. In the exemplary embodiment of FIGS. 2A and 2B, eight LEDs 190a are illustrated between the first pair of electrodes 130, 140 and eight LEDs 190b are illustrated between the second pair of electrodes 132, 142. Embodiments are not limited, however, to such a number of LEDs between the pairs of electrodes. The LEDs 190a, 190b may include, e.g., UV LEDs and/or blue LEDs.

Referring to FIGS. 1A, 2A, and 2B, for DC operation, e.g., the electrodes 130 and 132 may be electrically connected and/or receive a same first voltage while the electrodes 140 and 142 may be electrically connected and/or receive a same second voltage that is different from the first voltage. That is, e.g., a relationship between the electrode 130 and the other electrode 140 may be the same as a relationship between the electrode 132 and the electrode 142. More particularly, a first voltage, e.g., negative or relatively low voltage, may be applied to electrodes 130 and 132, and a second voltage, e.g., positive or relatively high voltage, may be applied to electrodes 140 and 142. Referring to FIGS. 1B, 2A and 2C, for AC operation, e.g., the electrodes 130 and 142 may be electrically connected and/or be in phase with each other while the electrodes 140 and 132 may be electrically connected and/or in phase with each other.

Figure 3A:
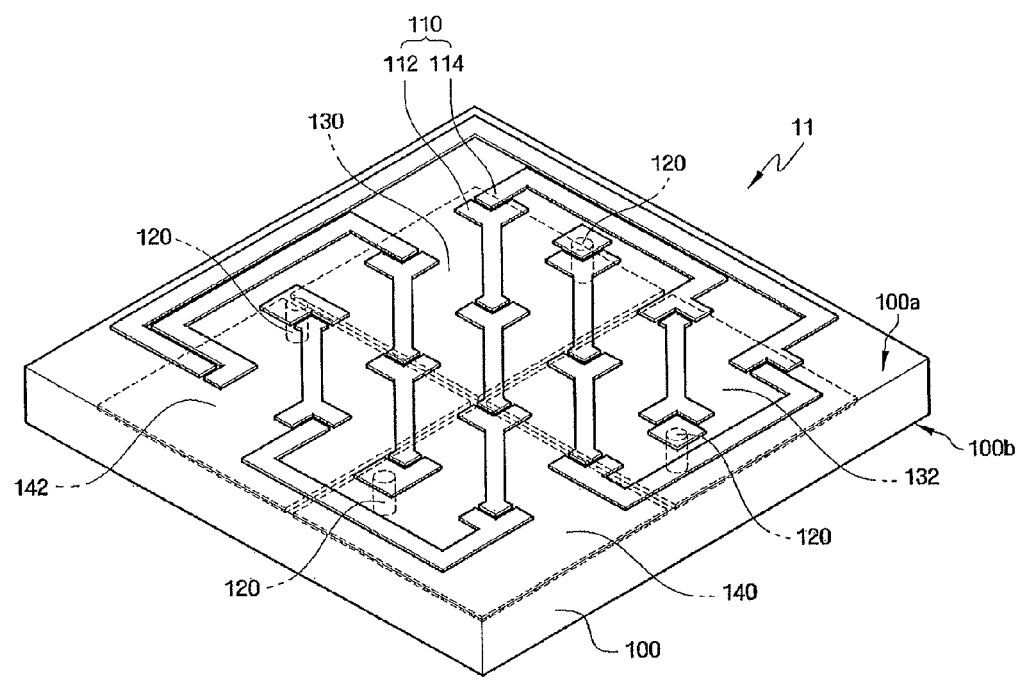
FIG. 3A illustrates a perspective elevational view of an exemplary sub-mount according to an exemplary embodiment.
Figure 3B:
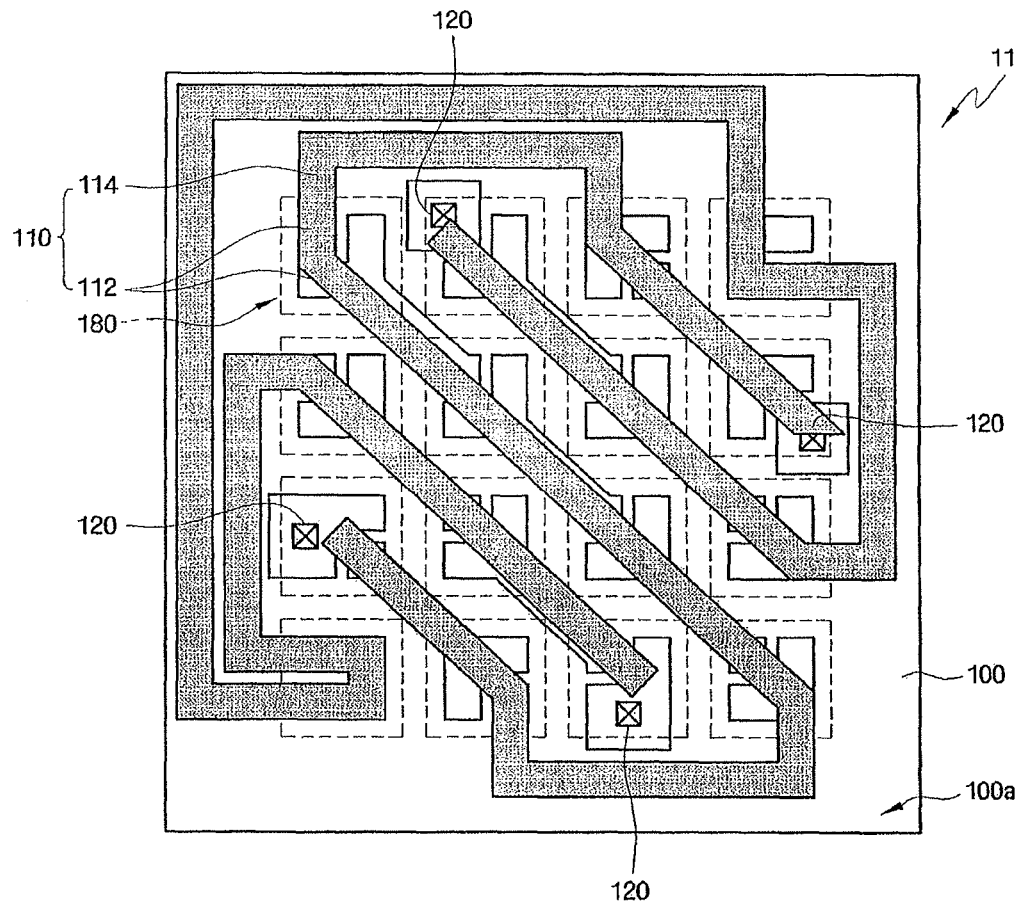
FIG. 3B illustrates a partial schematic diagram, including mounting regions, from a top of the exemplary sub-mount of FIG. 3A.
Figure 3C:
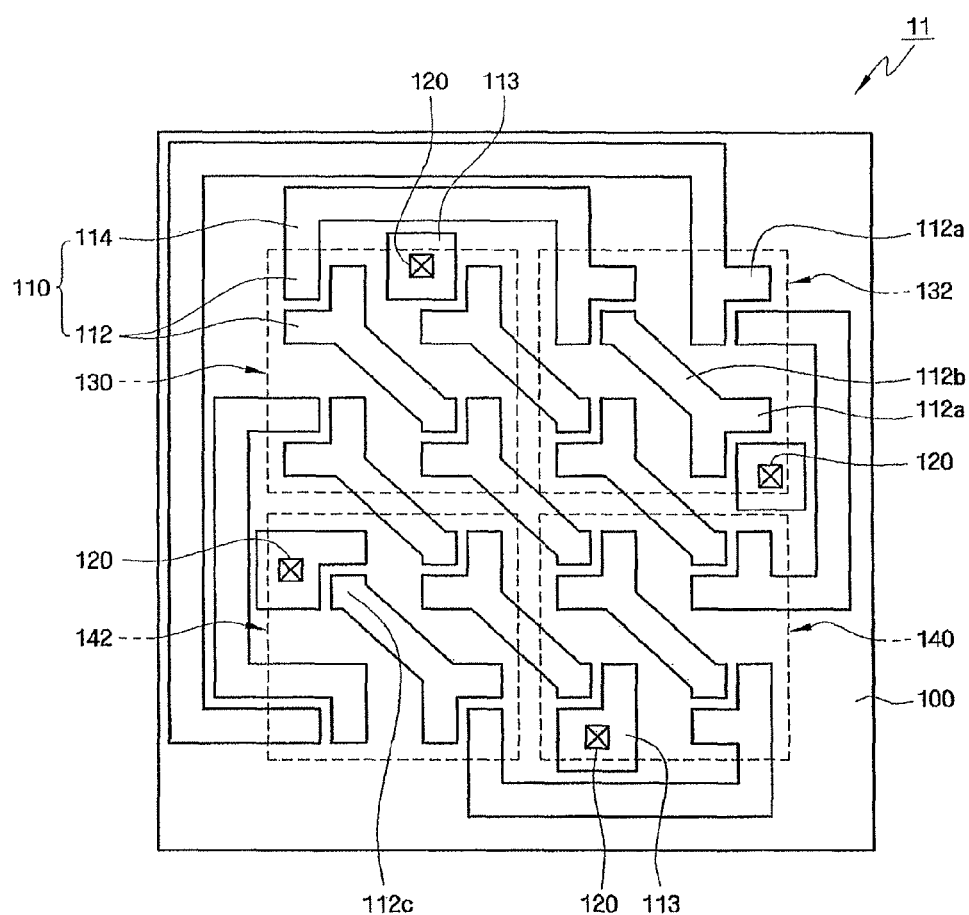
FIG. 3C illustrates a partial schematic diagram, including electrodes, from a top of the sub-mount of FIG. 3A.
Figure 3D:
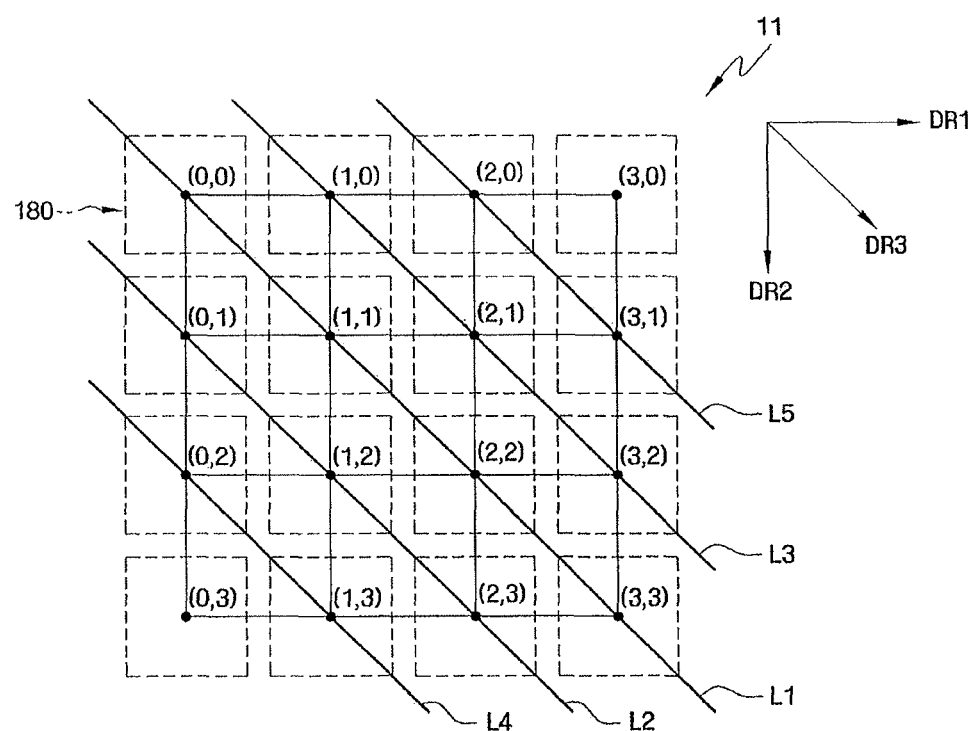
FIG. 3D illustrates a schematic diagram of an exemplary arrangement of mounting regions of the sub-mount of FIG. 3A.
Figure 3E:
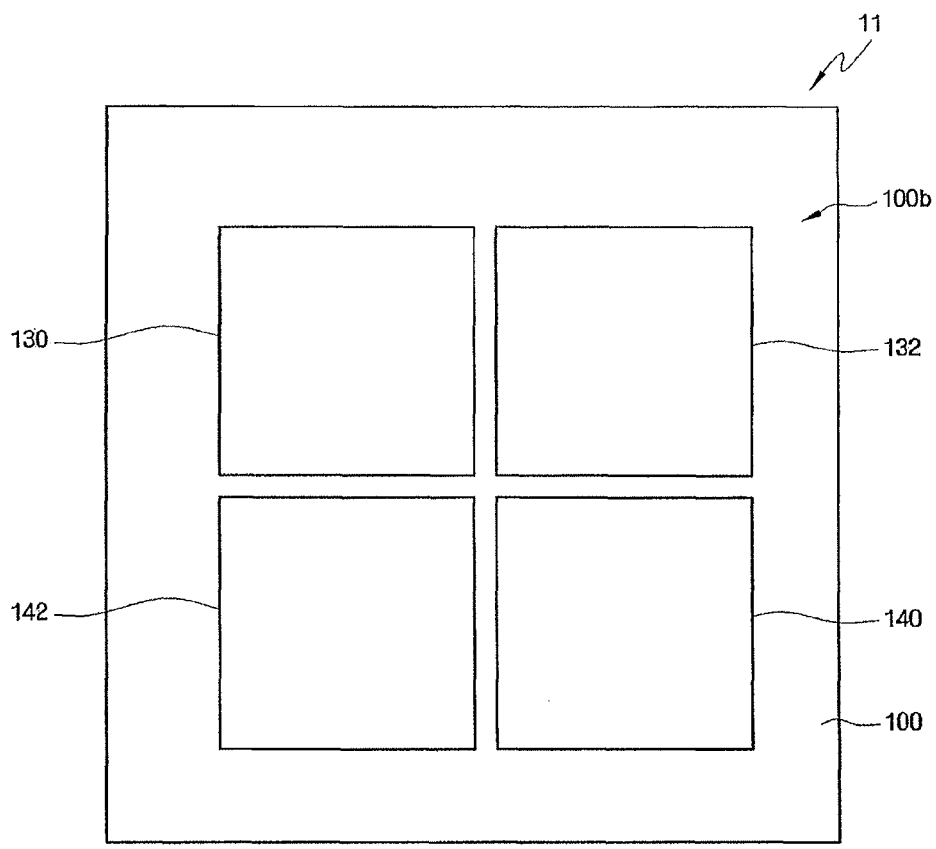
FIG. 3E illustrates a schematic diagram from a bottom of the exemplary sub-mount of FIG. 3A.

FIG. 3A illustrates a perspective elevational view of an exemplary sub-mount 11 according to an exemplary embodiment. FIG. 3B illustrates a partial schematic diagram, including mounting regions 180, from a top of the sub-mount 11 of FIG. 3A. FIG. 3C illustrates a partial schematic diagram, including electrodes, from a top of the sub-mount 11 of FIG. 3A. FIG. 3D illustrates a schematic diagram of an exemplary arrangement of the mounting regions 180 of the sub-mount 11 of FIG. 3A. FIG. 3E illustrates a schematic diagram from a bottom of the sub-mount 11 of FIG. 3A.

Referring to FIGS. 3A through 3E, the sub-mount 11 may include a base substrate 100, the first pair of electrodes 130, 140, the second pair of electrodes 132, 142, a conductive pattern 110, the mounting regions 180, and vias 120. Embodiments of the sub-mount 11 may provide the conductive pattern 110, and the first and second pair of electrodes 130, 140 and 132, 142, such that when elements, e.g., LEDs, are arranged on the mounting regions 180 of the sub-mount 11, a device including the sub-mount 11 may be operated under one of AC or DC conditions when the sub-mount 11 is in a first position relative to a mounting substrate (not shown) of the device and may be operated under the other of AC or DC conditions by rearranging the sub-mount 11 relative to the mounting substrate (not shown), e.g., rotating, e.g., by 90 degrees, the sub-mount 11 to a second position relative to the mounting substrate (not shown).

The base substrate 100 may correspond to a body of the sub-mount 11. The base substrate 100 may include, e.g., Si, strained Si, Si alloy, SOI, SiC, SiGe, SiGeC, Ge, Ge alloy, GaAs, InAs, AlN, polymer, plastic and/or ceramic, etc. The base substrate 100 may have any one of a variety of shapes, e.g., square, oval, etc.

The conductive pattern 110 may be arranged on a first surface 100a of the base substrate 100. The conductive pattern 110 may include, e.g., Cu, Al, Ag, Au, W, Pt, Ti, Zn and/or Ni, etc. The first pair of electrodes 130, 140 and the second pair of electrodes 132, 142 may be arranged on a second surface 100b of the base substrate 100. The first surface 100a may oppose the second surface 100b. The conductive pattern 110 and the vias 120 may enable elements, e.g., LEDs, to be arranged on the mounting regions 180 of the sub-mount to be electrically connected as shown in FIGS. 2A and 2B. The vias 120 may include a conductive material, e.g., metal.

More particularly, the conductive pattern 110 may include, e.g., mounting portions 112, wiring portions 114, and via portions 113. The wiring portions 114 may connect respective mounting portions 112 together. The mounting portions 112 may connect adjacent ones of the mounting regions 180 together. The via portions 113 may respectively overlap the vias 120 and connect ones of the mounting portions 112 to a respective one of the electrodes, e.g., 130, 132, 140, 142.

Referring to FIGS. 3B and 3C, the mounting portions 112 may be arranged in a matrix pattern. More particularly, e.g., at least portions of the mounting portions 112 may be arranged in, e.g., a 2×2, 4×4, 8×8, 2×8, etc., matrix pattern.

Referring to FIG. 3C, the mounting portions 112 may include a mounting sub-portion 112a and/or a connecting sub-portion 112b. In the exemplary embodiment of FIGS. 3A through 3C, the mounting portions 112 have a Y-like shape. More particularly, e.g., the mounting sub-portion 112a may have a V-like shape, and the connecting sub-portion 112b may be a stem portion extending towards an adjacent one of the mounting portions 112. As shown in FIG. 3C, the connecting sub-portion 112b may extend within a space defined by the mounting sub-portion 112a of the respective adjacent one of the mounting portions 112. In embodiments, e.g., one or more of the connecting sub-portions 112b may include end portions 112c having, e.g., an arrow like shape and/or one or more of the connecting sub-portions 112b may continuously connect to respective wiring portions 114. More particularly, e.g., in embodiments, the connecting sub-portions 112b may connect adjacent ones of the mounting sub-portions 112a together while the wiring portions 114 may connect together corresponding ones of the mounting sub-portions 112a that are not adjacent to each other.

As shown in FIGS. 3B and 3C, each of the mounting regions 180 may be associated with respective ones of the mounting portions 112. In embodiments, each of the mounting portions 112 may be associated with two adjacent ones of the mounting regions 180 so as to provide a conductive path adapted to connect corresponding adjacent ones of the mounting portions 112 in series. More particularly, as shown in FIG. 3B, each of the mounting regions 180 may be include at least a portion of a respective one of the mounting portions 112, e.g., respective mounting sub-region 112a, and/or a respective one of the connecting sub-portions 112b of another of the mounting portions 112.

Further, referring to FIGS. 3C and 3D, in embodiments, the mounting sub-portions 112a may define a matrix pattern. That is, e.g., the mounting sub-portions 112a may be arranged in rows extending along a first direction DR1 and columns extending along a second direction DR2. The connecting sub-portions 112b may extend between two adjacent mounting portions 112a along a third direction DR3.

Referring to FIG. 3D, the plurality of mounting regions 180 of the sub-mount 11 may correspond to a matrix pattern. Each one of the mounting sub-portions 112a may be in a respective one of the mounting regions 180 of the base substrate 100. Referring to FIG. 3D and FIGS. 2A and 2B, in such embodiments, a plurality of the mounting regions 180 extending along a same diagonal path may be connected in series. That is, e.g., in the exemplary embodiment of FIG. 3D with five diagonal lines L1, L2, L3, L4 and L5 of mounting regions 180 extending along the third direction DR3, the respective connecting sub-portions 112b may electrically connect adjacent ones of the mounting regions 180 along the third direction DR3. In embodiments, e.g., embodiments corresponding to FIGS. 2A and 2B, the (0,2), (1,3), (3,3), (2,2), (1,1), (0,0), (2,0) and (3,1) mounting regions 180 may be electrically connected in series via the respective mounting regions 180 at least when elements are respectively mounted thereon. Further, in such embodiments, e.g., the (2, 3), (1, 2), (0, 1), (0, 3), (3,0), (3,2), (2,1) and (1,0) mounting regions 180 may be electrically connected in series via the respective mounting regions 180 at least when elements are respectively mounted thereon.

In the exemplary embodiment of FIG. 3C, the connecting sub-portions 112b may extend along the third direction DR3. However, embodiments are not limited thereto as, e.g., the connecting sub-portions 112b may have a different shape, e.g., non-linear shape. Further, as shown in FIG. 3C, the connecting sub-portions 112b may be inherently/directly connected to the mounting sub-portion 112a of one of the mounting portions 112 and may be spaced apart from the mounting sub-portion 112a of the adjacent one of the mounting portions 112 along the third direction DR3. The third direction DR3 may form an acute angle with respect to each of the first direction DR1 and the second direction DR2.

Referring to FIGS. 3A, 3C and 3E, each of the pairs of electrodes 130, 140 and 132, 142 may include a first electrode, e.g., 130, 132, and a second electrode, e.g., 140, 142. Each of the electrodes 130, 132, 140, 142 may be connected to a respective portion of the conductive pattern 110 by way of one or more of the vias 120. The electrodes 130, 132, 140, 142 may be arranged, e.g., in a matrix pattern on the second surface 100b of the base substrate 100. More particularly, e.g., the electrodes 130, 132, 140, 142 may be arranged in, e.g., a 2×2, 1×4, 4×1, 3×3, 4×4, etc., matrix pattern.

In embodiments, the corresponding first and second electrodes of each of the first and second electrode pairs 130 and 140, 132 and 142 may be arranged so as to be in different columns and rows. For example, the corresponding first and second electrodes of the first electrode pair 130, 140 may be arranged at a diagonal relative to each other on the second surface 100b of the base substrate 100, and the corresponding first and second electrodes of the second electrode pair 32, 142 may be arranged at a diagonal relative to each other on the second surface 100b of the base substrate 100. Although FIG. 3C illustrates the electrodes 130, 132, 140, 142 arranged in a matrix pattern, embodiments are not limited thereto. For example, other arrangements enabling elements to be mounted on the mounting regions 180 between the electrodes 130, 132, 140, 142 to be electrically connected as shown in FIGS. 2A and 2B may be employed.

More particularly, e.g., LEDs, e.g., 190, may be mounted on mounting regions 180 of the sub-mount 11, and the sub-mount 11 may enable corresponding ones of the mounting portions 112 may be connected in series between each of the electrode pairs 130, 140 and 132, 142. Referring to FIGS. 2A and 2B and 3A through 3E, corresponding ones of the mounting portions 112 and the first group of LEDs 190a along the path between the first electrode pair 130, 140 may be driven based on voltages applied to the electrodes of the first electrode pair 130, 140. The corresponding ones of the mounting portions 112 and the second group of LEDs 190b along the path between the second electrode pair 132, 142 may be driven based on voltage applied to the electrodes of the second electrode pair 132, 142.

Each of the electrodes 130, 132, 140, 142 may overlap with a plurality of the mounting regions 180. In embodiments, the electrodes 130, 132, 140, 142 may cover an amount of the second surface 100b corresponding to a general size of the conductive pattern 110, e.g., may cover a majority and/or all of the second surface 100b directly below, i.e., overlapping, the conductive pattern 110 on the first surface 100a.

Each of the electrodes 130, 132, 140, 142 may be connected by way of, e.g., the respective via 120, to corresponding via portions 113 of the conductive pattern 110. When elements, e.g., LEDs, are mounted on the sub-mount 11, the via portions 113 of the conductive pattern 110 may be connected to respective ones of the mounting portions 112.

The vias 120 may extend through the base substrate 100. More particularly, e.g., the vias 120 may extend from the first surface 100a to the second surface 100b. The vias 120 may provide a conductive path between the electrodes 130, 132, 140, 142 and respective ones of the mounting regions 180.

Referring to FIGS. 3A through 3D, LEDs may be mounted onto the base substrate 100 at the mounting regions 180. More particularly, e.g., LEDs 190a, 190b of FIG. 2A may be mounted on to the mounting regions 180 of the base substrate 100.

Figure 4:
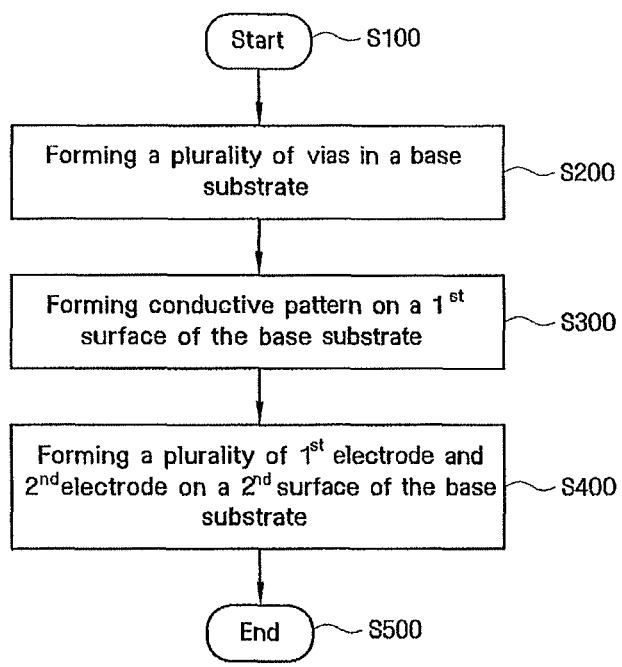
FIG. 4 illustrates a flow chart of an exemplary method of forming the exemplary sub-mount of FIGS. 3A-3E according to an exemplary embodiment.

FIG. 4 illustrates a flow chart of an exemplary method of forming the exemplary sub-mount 11 of FIGS. 3A-3E according to an exemplary embodiment. Formation of the sub-mount 11 may begin at S100. Referring to FIGS. 3A through 3E and 4, during S200, the vias 120 may be formed in the base substrate 100. The vias 120 may be formed by selectively masking the base substrate 100 and then removing, e.g., etching, the selectively masked substrate to generate openings in the substrate 100 in which conductive material may be filled. During 5300, the conductive pattern 110 may be formed on the first surface 100a of the base substrate 100. As described above, the conductive pattern 100 may include a plurality of the mounting portions 112, the via portions 113 and/or the wiring portions 114. During S400, the plurality of electrode pairs 130, 140 and 132, 142 may be formed on the second surface 100b of the base substrate 100. At 5500, formation of the sub-mount 11 may be complete.

Figure 5:
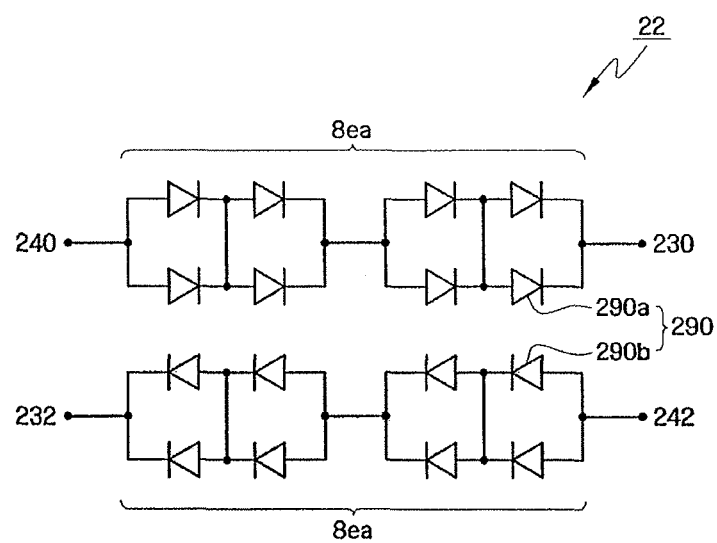
FIG. 5 illustrates a schematic diagram of electrical paths between two pairs of electrodes of a light emitting device according to another exemplary embodiment.

FIG. 5 illustrates a schematic diagram of electrical paths between two pairs of electrodes of a light emitting device 2 according to another exemplary embodiment. In general, only differences between the exemplary embodiment illustrated in FIG. 5 and the exemplary embodiment of FIGS. 2A and 2B will be described below, and like reference numerals correspond to like elements. Referring to FIG. 5, in embodiments, the light emitting device 2 may include a plurality of LEDs 290 electrically connected between at least two pairs of electrodes 230, 240 and 232, 242. In contrast to the exemplary embodiment of FIGS. 2A and 2B in which all the LEDs 190 are connected in series between the respective pair of electrodes 130, 140 and 132, 142, in the exemplary embodiment of FIG. 5, the LEDs 290 may be electrically connected in series and/or parallel.

Figure 6A:
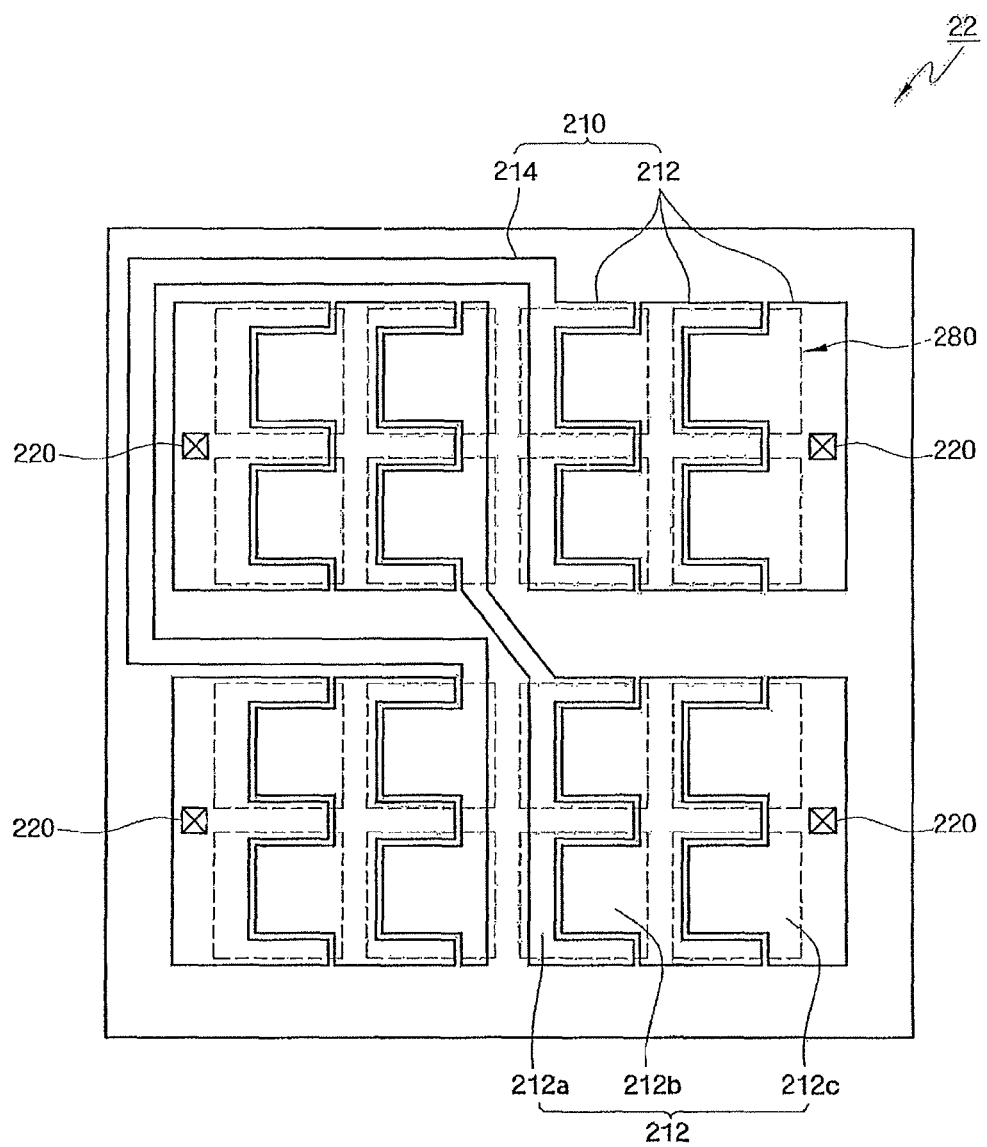
FIGS. 6A and 6B illustrate planar views from a top of an exemplary sub-mount without and with elements mounted thereon, respectively, according to another exemplary embodiment.
Figure 6B:
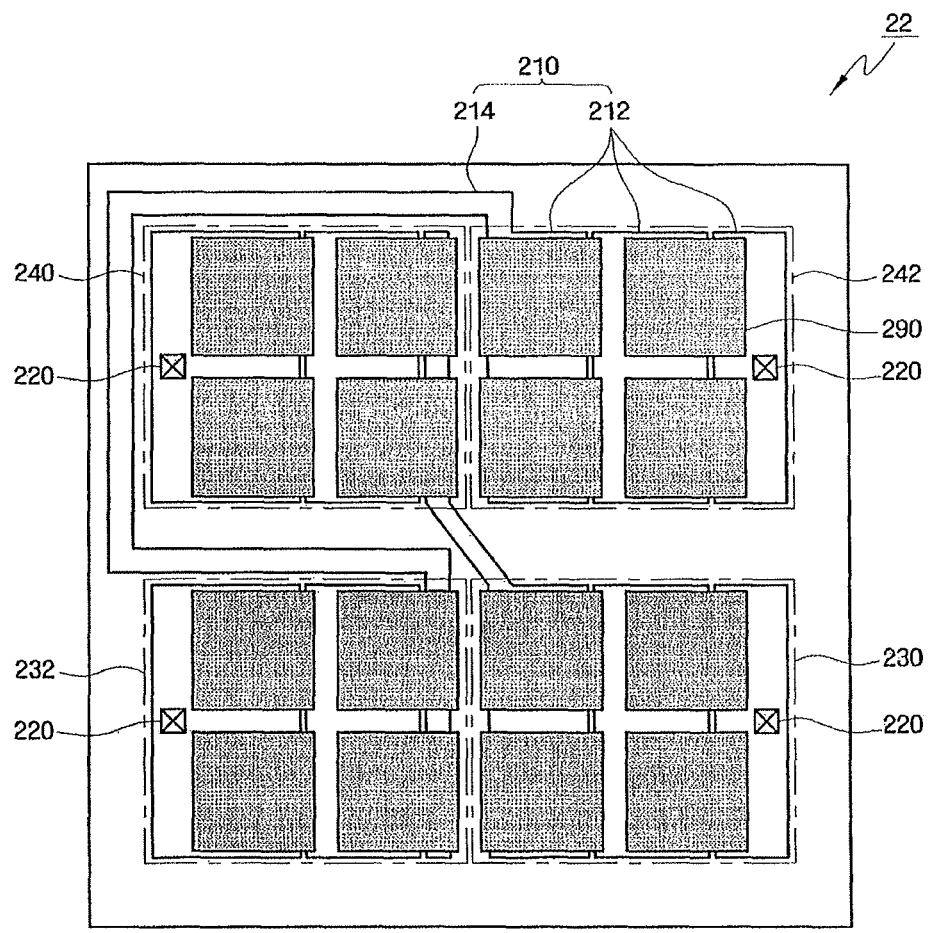

FIGS. 6A and 6B illustrate planar view from a top of an exemplary sub-mount 22 without and with the LEDs 290 mounted thereon, respectively, according to an exemplary embodiment that may be employed to implement the electrical paths illustrated in FIG. 5. In general, only differences between the exemplary embodiment illustrated in FIGS. 6A and 6B and the exemplary embodiment of FIGS. 3A through 3E will be described below, and like reference numerals correspond to like elements.

Referring to FIGS. 6A and 6B, the sub-mount 22 may include a conductive pattern 210, vias 220, the plurality of pairs of electrodes 230, 240 and 232, 242, and a plurality of mounting regions 280. The conductive pattern 210 may be arranged on a first surface of a substrate 200 and the two pairs of electrodes 230, 240 and 232, 242 may be arranged on a second surface of the substrate 200 that opposes the first surface. The vias 220 may extend through the substrate 200 between the first surface and the second surface thereof.

The conductive pattern 210 may include mounting portions 212 and wiring portions 214. In embodiments, the conductive pattern 210, the vias 220 and the electrodes 230, 232, 240, 242 may be arranged so as to enable the LEDs 290 to be mounted on the sub-mount 22 to be electrically connected as shown in FIG. 5. Thus, in the exemplary embodiment of FIGS. 6A and 6B, the conductive pattern 210, and more particularly, the mounting portions 212 and the wiring portions 214 may have a pattern that enables the serial and/or parallel connections shown in FIG. 5. The wiring portions 214 may connect respective ones of the mounting portions 212 together.

Referring to FIG. 6A, each of the mounting portions 212 may include a plurality of mounting sub-portions, e.g., first, second and third mounting sub-portions 212a, 212b, 212c. In the exemplary embodiment of FIG. 6A, the first mounting sub-portion 212a has an E-like shape, and the second mounting sub-portions 212b includes an E-like shaped portion and an inverse-E-like shaped portion. In the exemplary embodiment of FIG. 6A, the inverse-E-like shaped portion may substantially correspond to a portion of the second mounting sub-portion 212b having a shape complementary to prongs of the E-like shaped first mounting sub-portions 212a. Further, in the exemplary embodiment of FIG. 6A, the third mounting sub-portion 212c may have an inverse-E-like shape that is complementary to prongs of the E-like shaped portion of the second mounting sub-portion 212b. The first, second and third mounting sub-portions 212a, 212b, 212c of each mounting portion 212 may be arranged so as to be spaced apart from each other, but relatively close together so as to generally define a substantially continuous unified shape, e.g., a square, rectangle, etc. The mounting sub-portions 212a, 212b, 212c of each of the mounting portions 212 may be connected through the respective LEDs 290 that may be mounted on to the mounting regions 280.

In the exemplary embodiment illustrated in FIGS. 6A and 6B, each of the mounting portions 212 may be associated with four of the LEDs 290 and may be respectively arranged on four mounting regions 280 of the respective mounting portion 212.

Referring to FIG. 6B, the pairs of electrodes 230, 240 and 232, 242 may be arranged on the second surface of the substrate 200 in a manner similar to that of the pairs of electrodes 130, 140 and 132, 142 of FIGS. 3A through 3E.

In embodiments, the plurality of electrode pairs, e.g., the two pairs of electrodes 130, 140 and 132, 142 may be driven in a manner that enables the LEDs 290 mounted on the sub-mount 22 to operate under both AC and DC conditions. More particularly, e.g., in embodiments, the plurality of electrode pairs, e.g., the two pairs of electrodes 130, 140 and 132, 142 may be driven in a manner that enables the LEDs 290 that may be mounted on the sub-mount 22 to operate under both AC and DC conditions by, e.g., rotating the mounting substrate. In the exemplary embodiment of FIGS. 5, 6A and 6B, eight LEDs 290a are illustrated between the first pair of electrodes 230, 240 and eight LEDs 290b are illustrated between the second pair of electrodes 232, 242. Embodiments are not limited, however, to having eight LEDs between the pairs of electrodes. For example, as described below, FIGS. 7 and 8 illustrate embodiments including thirty-two LEDs.

Further, in the exemplary embodiments illustrated in FIGS. 3A through 3E, 6A and 6B, the sub-mounts 11, 22 each include 16 mounting regions 180, 280, respectively. Embodiments are not limited, however, to having, e.g., 16 mounting regions 180, 280.

Figure 7:
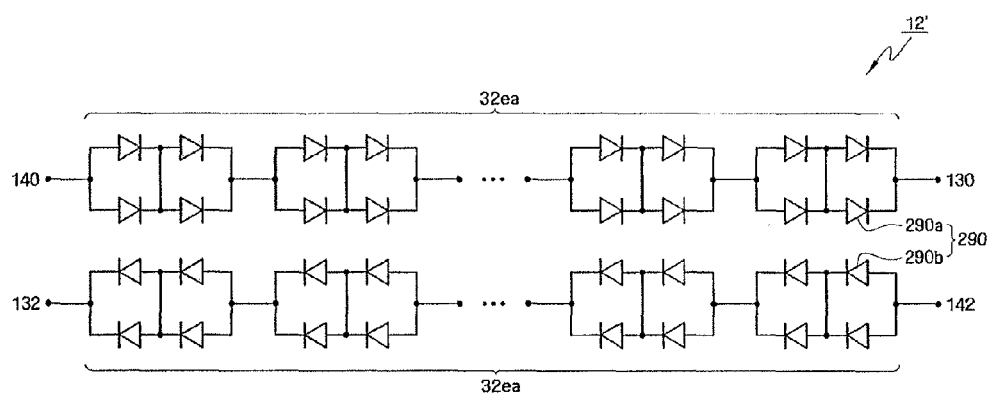
FIG. 7 illustrates a schematic diagram of electrical paths between two pairs of electrodes of a light emitting device according to another exemplary embodiment.

FIG. 7 illustrates a schematic diagram of electrical paths between two pairs of electrodes of a light emitting device 12' according to another exemplary embodiment. The exemplary light emitting device 12' of FIG. 7 substantially corresponds to the exemplary light emitting device 12 of FIG. 5, but including thirty-two LEDs 290a between the first pair of electrodes 230, 240 and thirty-two LEDs 290b between the second pair of electrodes 232, 242. Accordingly, the exemplary light emitting device 12 of FIG. 5 may include sixty-four LEDs 290.

Figure 8:
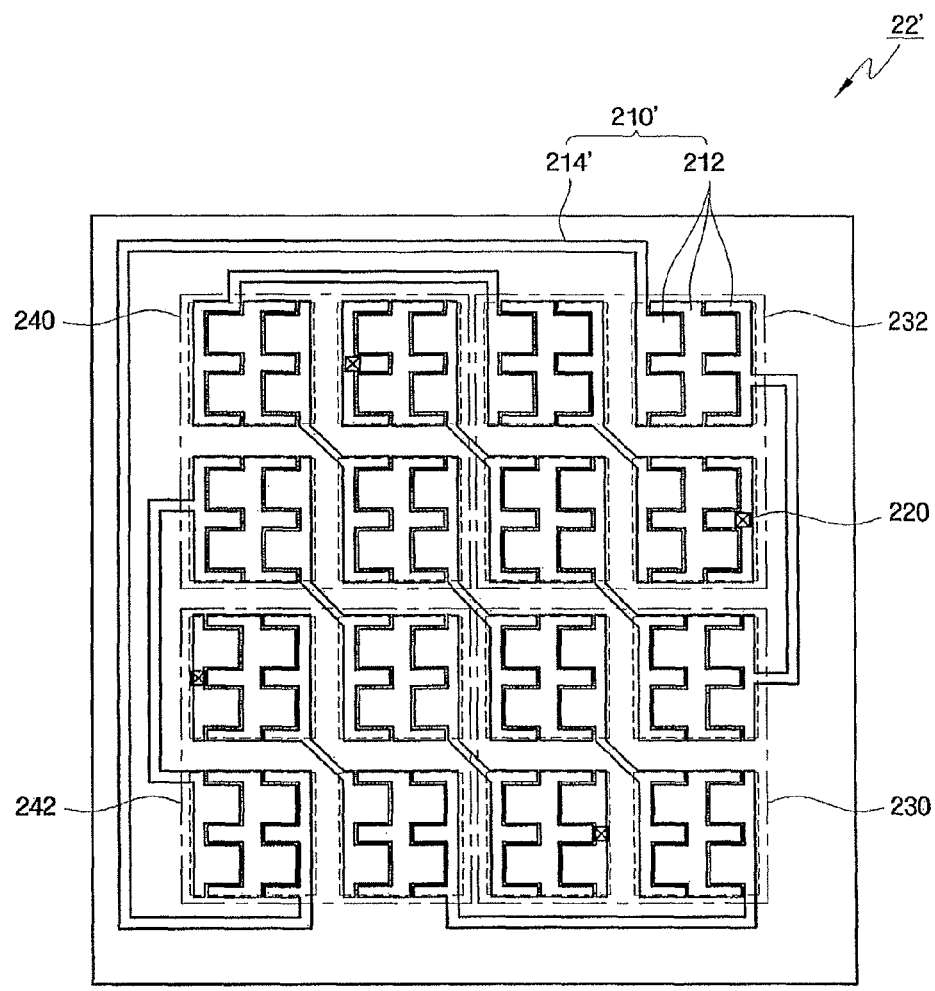
FIG. 8 illustrates a schematic diagram from a top of an exemplary sub-mount according to another exemplary embodiment.

FIG. 8 illustrates a schematic diagram from a top of an exemplary sub-mount 22' according to another exemplary embodiment. The exemplary sub-mount 22' of FIG. 7 substantially corresponds to the exemplary sub-mount 12 of FIGS. 6A and 6B, but including thirty-two LEDs 290a, in contrast to eight LEDs, between the first pair of electrodes 230, 240 and thirty-two LEDs 290b between the second pair of electrodes 232, 242. The sub-mount 22' may include a conductive pattern 210', vias 220 and the pairs of electrodes 130, 140 and 132, 142. The conductive pattern 210' may include the mounting portions 212 and a wiring region 214'. As shown in FIG. 8, the wiring region 214' may be arranged so as to connect the mounting portions 212 together in groups of eight mounting portions 212.

Figure 9A:
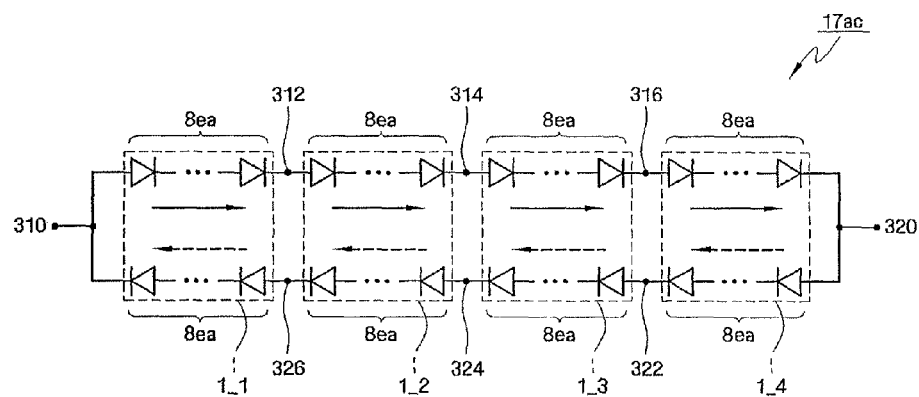
FIGS. 9A and 9B illustrate schematic diagrams of electrical paths of light emitting devices adapted for AC and DC operation, respectively.
Figure 9B:
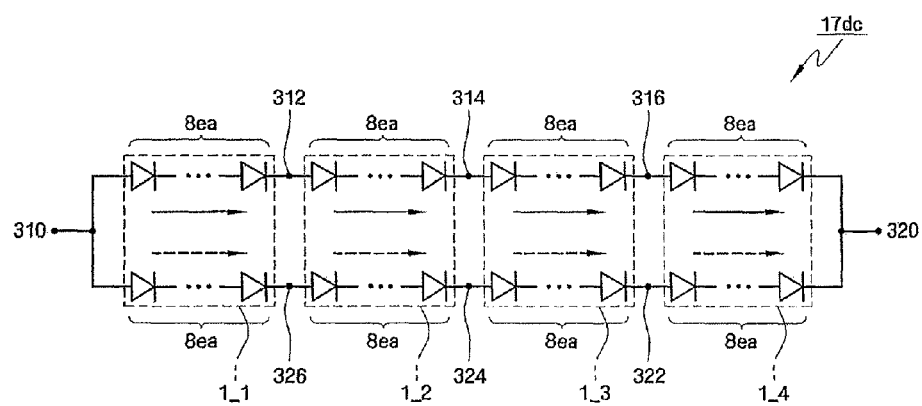

FIGS. 9A and 9B illustrate schematic diagrams of electrical paths of light emitting devices 17ac, 17dc adapted for AC and DC operation, respectively. Referring to FIGS. 9A and 9B, the light emitting devices 17ac, 17dc may include a plurality of groups, e.g., two groups, of the light emitting devices 1 including sub-mounts 1_1, 1_2, 1_3, 1_4 one or more of which may correspond, e.g., to the sub-mount 11, of FIGS. 2A, 2B and 3A through 3D, arranged between two nodes, e.g., two power supplies 310, 320. More particularly, e.g., in the exemplary embodiments of FIGS. 9A and 9B, each of the light emitting devices 17ac, 17dc includes, e.g., four of the light emitting devices 1 of FIG. 1 arranged in series between the two power supplies 310, 320. More particularly, e.g., each of the light emitting device 17ac, 17dc may include, e.g., a first group of thirty-two LEDs between the two power supplies 310, 320 along a first path connected by connecting portions 312, 314, 316 and a second group of thirty-two LEDs between the two power supplies 310, 320 along a second path connected by connecting portions 322, 324, 326.

Figure 10A:
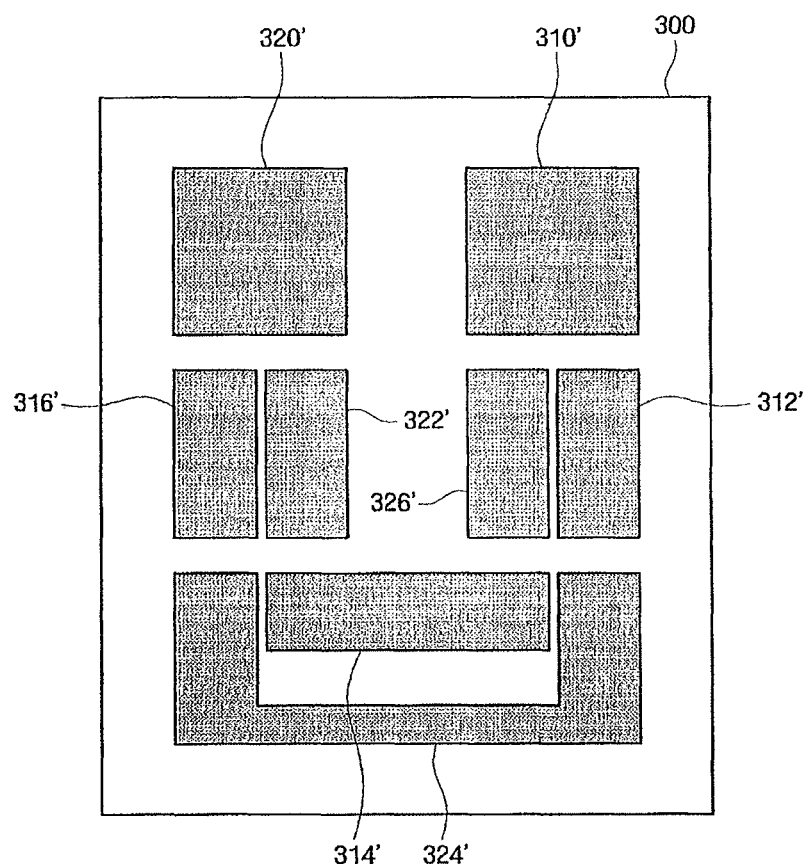
FIG. 10A illustrates a block diagram of a circuit substrate employable for implementing the exemplary light emitting devices of FIGS. 9A and 9B according to another exemplary embodiment.
Figure 10B:
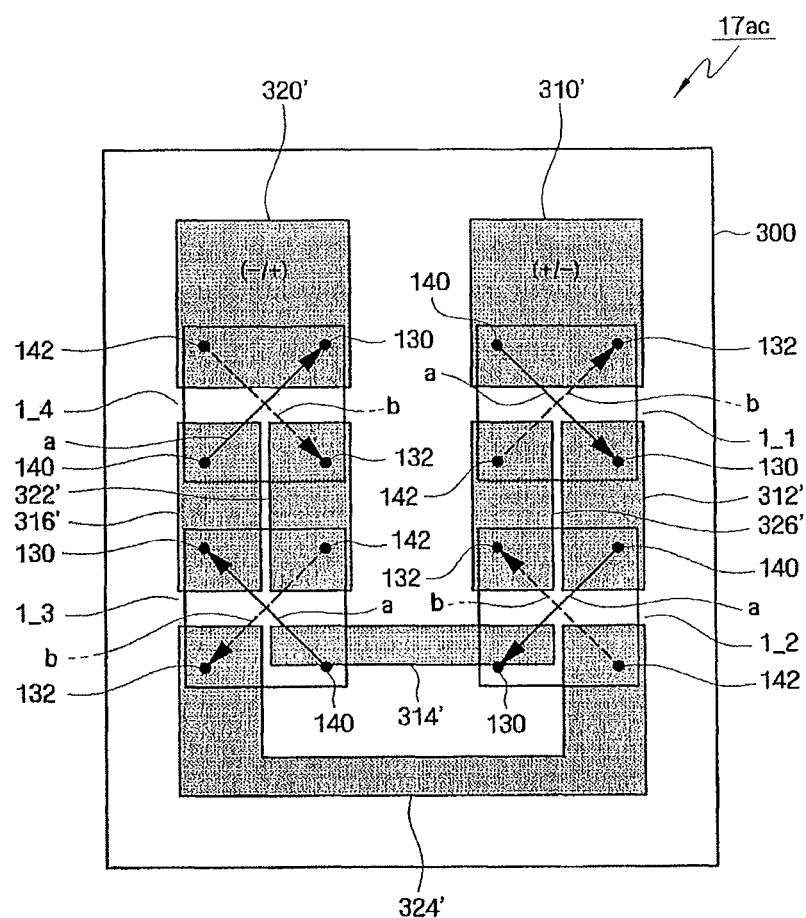
FIGS. 10B and 10C illustrate block diagrams of the circuit substrate of FIG. 10A including sub-mounts mounted thereon for AC and DC operation of the light emitting devices of FIGS. 9A and 9B, respectively, according to another exemplary embodiment.
Figure 10C:
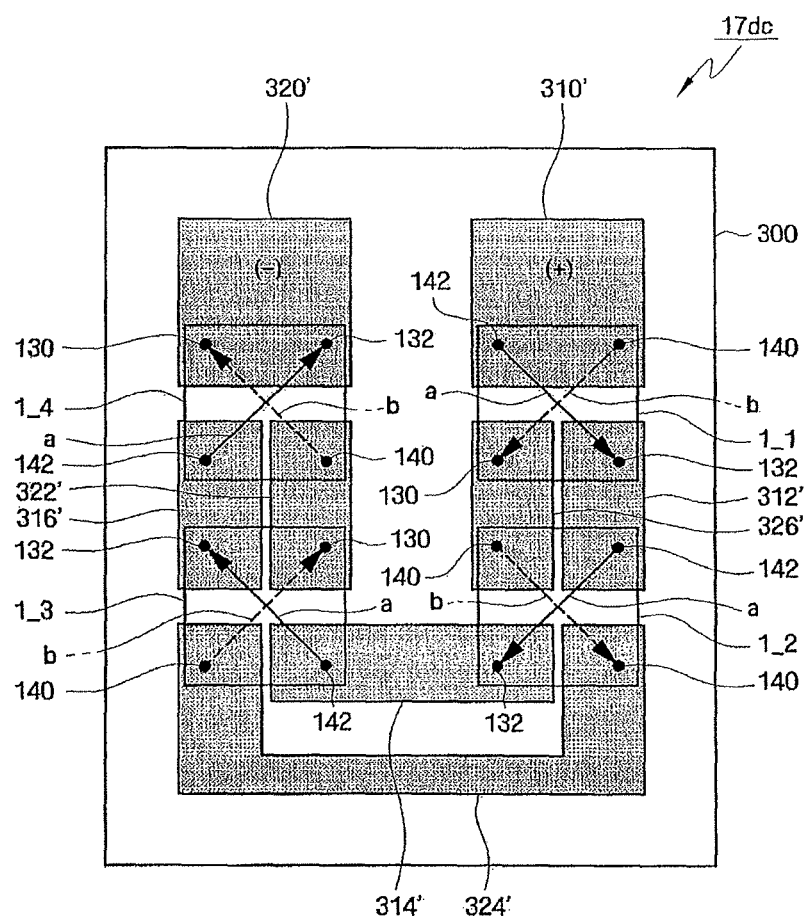

FIG. 10A illustrates a block diagram of a circuit substrate employable for implementing the exemplary light emitting devices 17ac, 17dc of FIGS. 9A and 9B according to an exemplary embodiment. Referring to FIG. 10A through 10C, the circuit substrate 300 may include a power supply pattern 310, a second power supply pattern 320, a plurality of connecting patterns 312', 314', 316', 322', 324', and 326', and a plurality of sub-mounts 1_1, 1_2, 1_3, 1_4 arranged thereon. The sub-mounts 1_1, 1_2, 1_3, 1_4 may each correspond to the sub-mount 11 of FIG. 3A through 3E. More particularly, referring to FIGS. 9A, 9B, 10A, 10B and 10C, the connecting portions 312, 314, 316, 322, 324, 326 may respectively correspond to the connecting patterns 312', 314', 316', 322', 324', 326'. The two power supplies 310, 320 may correspond to the first power supply pattern 310' and the second power supply pattern 320'.

More particularly, referring to FIG. 10A, the first power supply pattern 310', the second power supply pattern 320', and the connecting patterns 312', 314', 316', 322', 324', 326' may be arranged on the circuit substrate 300. The connecting patterns 312', 314', 316', 322', 324', 326' may be arranged so as to be along an electrical path between the first power supply pattern 310 and the second power supply pattern 320. Referring to FIG. 10A, the connecting patterns 312', 314', 316', 322', 324', 326' may form a substantially U-like shape between the first power supply pattern 310' and the second power supply pattern 320'. The first and second power supply patterns 310, 320 and the connecting patterns 312', 314', 316', 322', 324', 326' may each have, e.g., a polygonal, e.g., square, rectangular shape. The first and second power supply patterns 310', 320' and the connecting patterns 312', 314', 316', 322', 324', 326' may be spaced apart from each other on the circuit substrate 300.

FIGS. 10B and 10C illustrate block diagrams of the circuit substrate of FIG. 10A including the sub-mounts 1_1, 1_2, 1_3, 1_4 mounted thereon for AC and DC operation of the light emitting devices of FIGS. 9A and 9B, respectively, according to another exemplary embodiment. The light emitting devices 17ac, 17dc may substantially correspond to each other, but for the arrangement of the sub-mounts 1_1, 1_2, 1_3, 1_4 relative to the circuit substrate 300. More particularly, e.g., the light emitting devices 17ac, 17dc of FIGS. 10B and 10C may be the same, other than each of the sub-mounts 1_1, 1_2, 1_3, 1_4 being rotated 90 degrees relative to the circuit substrate 300.

More particularly, for AC operation with the circuit substrate 300 of FIG. 10A, e.g., as shown in FIG. 10B, the sub-mount 1_1 may be arranged such that electrodes 132, 140 may be electrically connected to the first power supply pattern 310 and the electrodes 130, 142 may be arranged such that the electrodes 130, 142 may be electrically connected to the connecting patterns 312, 326, respectively. For DC operation with the circuit substrate 300, the sub-mount 1_1 may be arranged such that electrodes 142, 140 are electrically connected to the first power supply pattern 310 and the electrodes 130, 132 may be arranged such that the electrodes 130, 132 are electrically connected to the connecting patterns 312, 326, respectively. That is, e.g., for both AC and DC operation using the circuit substrate 300, the sub-mount 1_1 may be electrically connected to the same first power supply pattern 310 and the same connecting patterns 312, 326, but may be rotated, e.g., by 90 degrees, such that different electrodes of the sub-mount 1_1 are connected to the first power supply pattern 310 and the same connecting patterns 312, 326 for AC and DC operation.

Referring still to FIGS. 10B and 10C, e.g., for AC operation with the light emitting device 17ac, the sub-mount 1_2 may be arranged such that electrodes 132, 140 are electrically connected to the connecting patterns 326, 312, respectively, and the electrodes 130, 142 are electrically connected to the connecting patterns 324, 314 respectively. In contrast, for DC operation with the light emitting device 17dc, the sub-mount 1_2 may be arranged such that electrodes 140, 142 are electrically connected to the connecting patterns 326, 312, respectively, and the electrodes 130, 132 are electrically connected to the connecting patterns 324, 314, respectively. That is, e.g., for both AC and DC operation using the circuit substrate 300, the sub-mount 12 may be electrically connected to the same connecting patterns 312, 314, 324, 326, but may be rotated, e.g., by 90 degrees, such that different electrodes of the sub-mount 1_1 are connected to connecting patterns 312, 314, 324, 326 for AC and DC operation.

Referring still to FIGS. 10B and 10C, e.g., for AC operation with the light emitting device 17ac, the sub-mount 1_3 may be arranged such that electrodes 140, 132 are electrically connected to the connecting patterns 314, 324, respectively, and the electrodes 130, 142 are electrically connected to the connecting patterns 316, 322 respectively. In contrast, for DC operation with the light emitting device 17dc, the sub-mount 1_3 may be arranged such that electrodes 140, 142 are electrically connected to the connecting patterns 324, 314, respectively, and the electrodes 130, 132 are electrically connected to the connecting patterns 322, 316, respectively. That is, e.g., for both AC and DC operation using the circuit substrate 300, the sub-mount 1_3 may be electrically connected to the same connecting patterns 314, 316, 322, 324 but may be rotated, e.g., by 90 degrees, such that different electrodes of the sub-mount 1_1 are connected to connecting patterns 314, 316, 322, 324 for AC and DC operation.

More particularly, for AC operation with the circuit substrate 300 of FIG. 10A, e.g., as shown in FIG. 10B, the sub-mount 1_4 may be arranged such that electrodes 132, 140 may be electrically connected to the connecting patterns 322, 316, respectively, and the electrodes 130, 142 may be electrically connected to the second power supply pattern 320. For DC operation with the circuit substrate 300, the sub-mount 1_4 may be arranged such that electrodes 142, 130 are electrically connected to the second power supply pattern 320 and the electrodes 132, 140 may be arranged such that the electrodes 132, 140 are electrically connected to the connecting patterns 322, 316, respectively. That is, e.g., for both AC and DC operation using the circuit substrate 300, the sub-mount 14 may be electrically connected to the same second power supply pattern 320 and the same connecting patterns 322, 316, but may be rotated, e.g., by 90 degrees, such that different electrodes of the sub-mount 14 are connected to the second power supply pattern 320 and the same connecting patterns 322, 316 for AC and DC operation.

Accordingly, as shown in FIGS. 10A through 10C, embodiments may provide a circuit substrate 300, which may be employed with same sub-mounts, e.g., 1_1, 1_2, 1_3, 1_4 that are merely positioned differently, e.g., rotated 90 degrees, depending on whether the resulting device, e.g., 17ac, 17dc, is DC or AC operated.

Figure 11A:
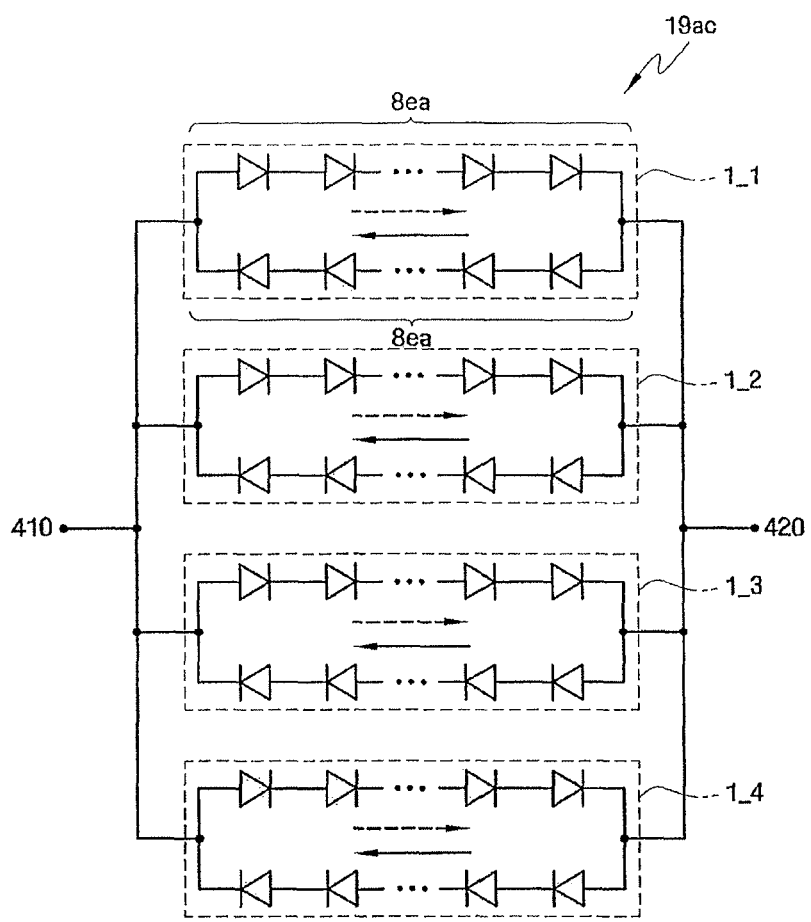
FIGS. 11A and 11B illustrate schematic diagrams of electrical paths of light emitting devices adapted for AC and DC operation, respectively.
Figure 11B:
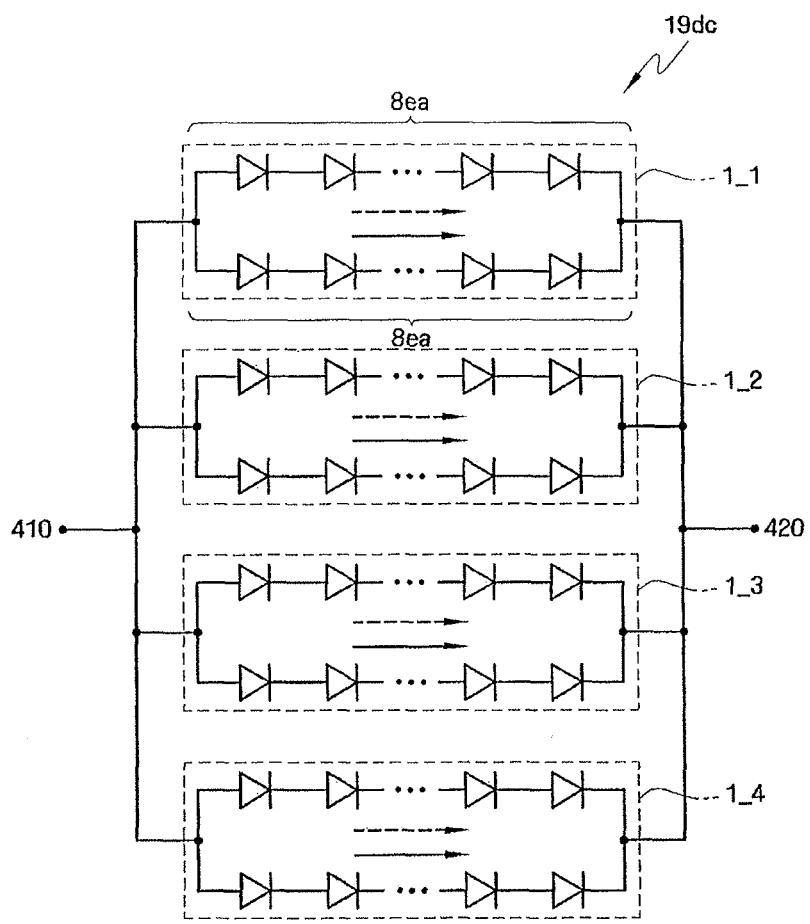
Figure 12A:
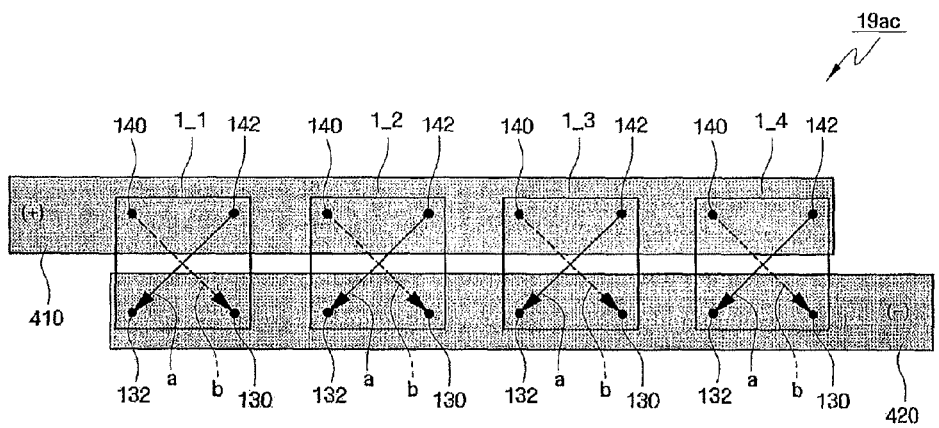
FIGS. 12A and 12B illustrate block diagrams of the exemplary arrangement of sub-mounts on power supply electrodes for implementing the light emitting devices of FIGS. 11A and 11B, respectively, according to another exemplary embodiment.
Figure 12B:
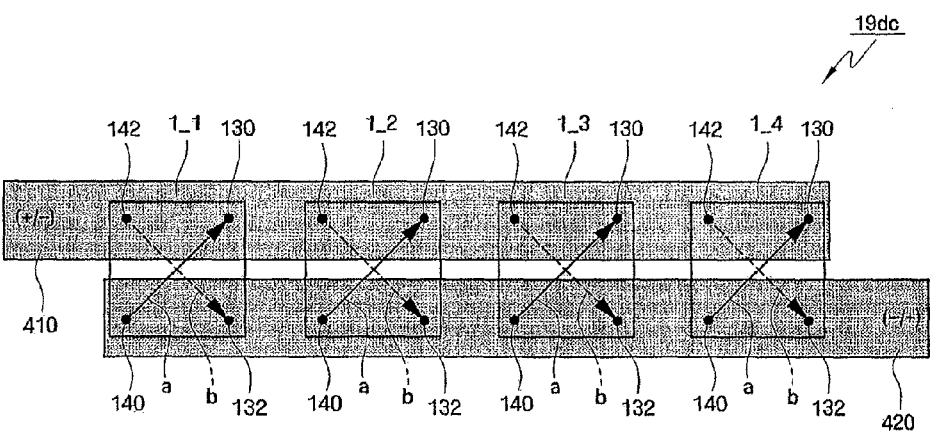

FIGS. 11A and 11B illustrate schematic diagrams of electrical paths of light emitting devices 19ac, 19dc adapted for AC and DC operation, respectively. FIGS. 12A and 12B illustrate block diagrams of the exemplary arrangement of sub-mounts 1_1, 1_2, 1_3, 1_4 on power supply electrodes 410, 420 for implementing the light emitting devices 19ac, 19dc of FIGS. 11A and 11B, respectively, according to another exemplary embodiment.

Referring to FIGS. 11A and 11B, the light emitting devices 19ac, 19dc may include a plurality of groups, e.g., two groups, of the light emitting devices 1 including sub-mounts 1_1, 1_2, 13, 1_4, one or more of which may correspond, e.g., to the sub-mount 11, of FIGS. 2A and 2B and 3A through 3D, arranged between two nodes, e.g., two power supply electrodes 410, 420. Referring to FIGS. 11A and 11B, the light emitting devices 19ac, 19dc may include a plurality of groups, e.g., two groups, of the light emitting devices 1 including sub-mounts 11 of FIGS. 2A and 2B and 3A through 3D arranged between two nodes, e.g., the two power supplies 410, 420. More particularly, e.g., in the exemplary embodiment, each of the light emitting devices 19ac, 19dc includes, e.g., four of the light emitting devices 1 of FIG. 1 arranged in parallel between the two power supply electrodes 410, 420.

In the exemplary embodiments of FIGS. 12A and 12B, the sub-mounts 1_1, 1_2, 1_3, 1_4 are connected to the power supply electrodes 410, 420. The power supply electrodes 410, 420 may be arranged on a substrate (not shown). For AC operation, as shown in FIG. 12A, the sub-mounts 1_1, 1_2, 1_3, 1_4 may be arranged such that the electrodes 140, 142 of each of the sub-mounts 1_1, 1_2, 1_3, 1_4 is connected to the first power supply electrode 410, and the electrodes 130, 132 of each of the sub-mounts 1_1, 1_2, 1_3, 1_4 is connected to the second power supply electrode 420.

For DC operation, as shown in FIG. 12B, the sub-mounts 1_1, 1_2, 1_3, 1_4 may be arranged such that the electrodes 130, 142 of each of the sub-mounts 1_1, 1_2, 1_3, 1_4 is connected to the first power supply electrode 410, and the electrodes 140, 132 of each of the sub-mounts 1_1, 1_2, 1_3, 1_4 is connected to the second power supply electrode 420. In such embodiments, no other conductive patterns need be employed to connect electrically connect the respective electrodes 130, 132, 140, 142 of the sub-mount 11 to the first and second power supply electrodes 410, 420.

Figure 13:
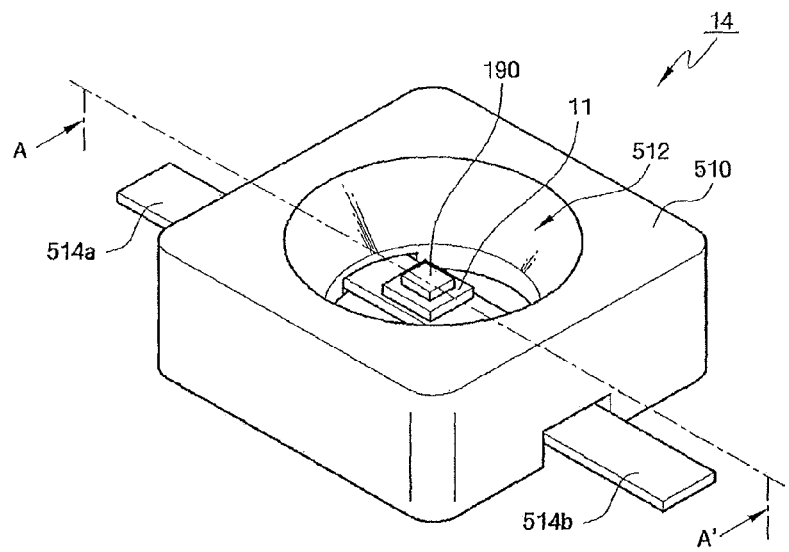
FIG. 13 illustrates an elevational schematic diagram of an exemplary light emitting device including the sub-mount 11 of FIGS. 3A through 3E.

FIG. 13 illustrates an elevational schematic diagram of an exemplary light emitting device 14 including the sub-mount 11 of FIGS. 3A through 3E. Referring to FIG. 13, the light emitting device 14 may include, e.g., the sub-mount of FIGS. 3A through 3E arranged on leads 514a, 514b exposed by a slot 512 within a package body 510.

As discussed above, a plurality of LEDs 190 may be mounted on the sub-mount 11. Two of the electrodes, e.g., 140, 132 may be connected to one of the leads 514a and two of the electrodes, e.g., 142, 130, may be connected to the other of the leads 514b. The leads 514a, 514b may be electrically connected to the respective LEDs 190 by way of the electrodes 130, 132, 140, 142 and the vias 120 of the sub-mount 11.

As shown in FIG. 13, sides of the slot 512 may be oblique and light generated by the LEDs 190 may be reflected at the sides of the slot 512. The package body 510 may include, e.g., Si resin, epoxy resin, acrylic resin, glass and/or silica, etc.

Figure 14A:
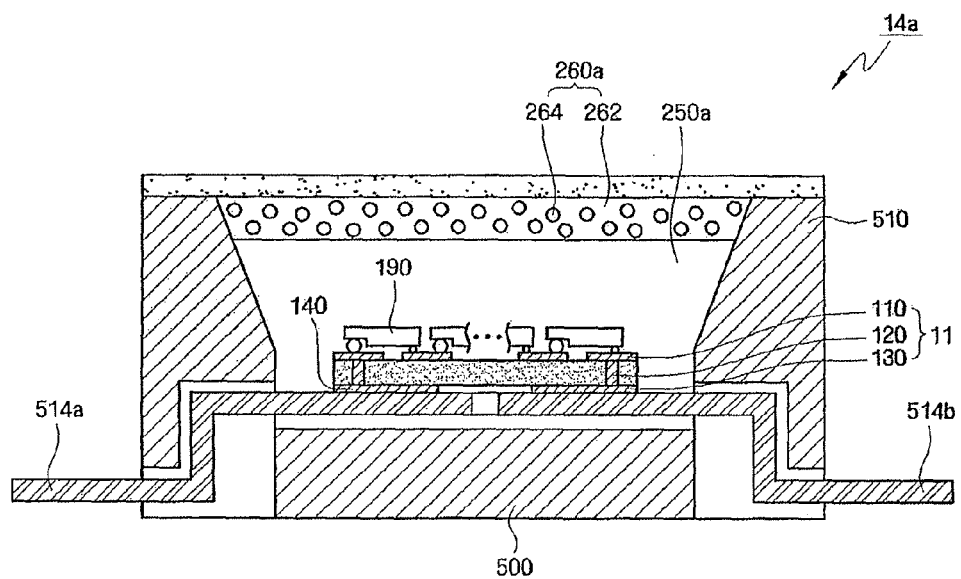
FIGS. 14A, 14B, and 14C illustrate cross-sectional views of the exemplary light emitting device of FIG. 13 including exemplary arrangements of phosphor therein.
Figure 14B:
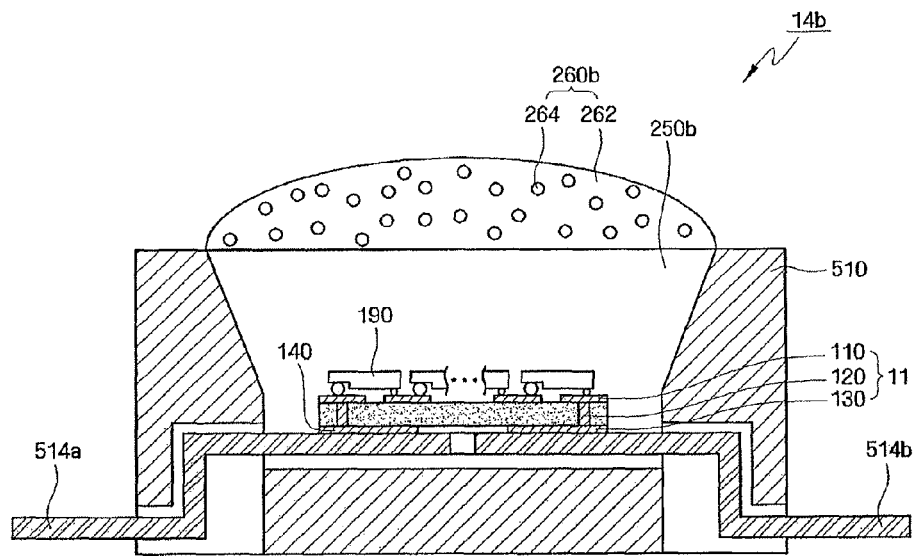
Figure 14C:
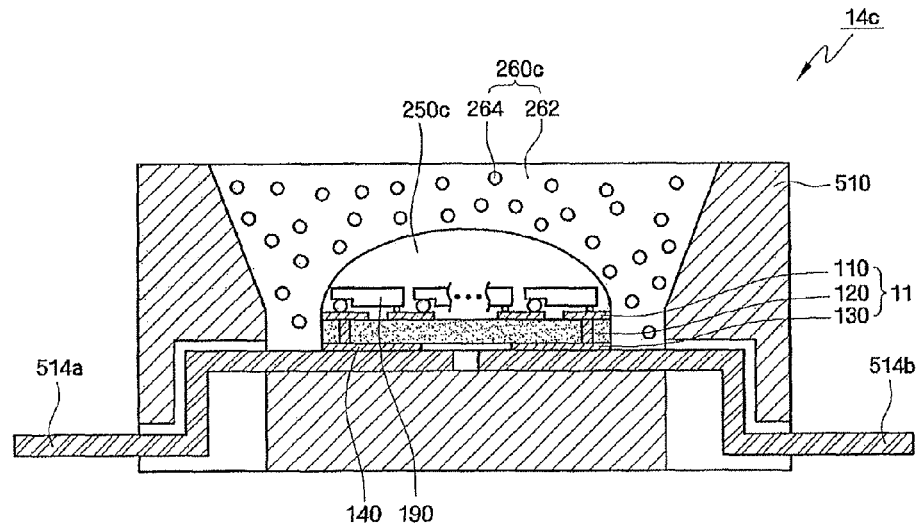

FIGS. 14A, 14B, and 14C illustrate cross-sectional views of the exemplary light emitting device 14a, 14b, 14c of FIG. 13 including exemplary arrangements of phosphor 264 therein. The light emitting device 14a, 14b, 14c may include transparent resin 250 and a phosphor layer 260. The phosphor layer 260 may include transparent resin 262 with the phosphor 264 dispersed therein. More particularly, the phosphor 265 may be dispersed on and/or within the transparent resin 262 of the phosphor layer 260. The phosphor 264 may include, e.g., nitride/oxide material that may be activated by a lanthanide, e.g., Eu, Ce, etc. The phosphor 264 may absorb light generated by the LEDs 190 and may convert the wavelength of the light. The transparent resin 250, 262 may include, e.g., epoxy resin, acrylic resin, and/or urethane resin, etc. The package body 510 may include and/or be arranged on a substrate 500.

As shown in FIG. 14A, in embodiments, a transparent resin 250 may partially fill the slot 512 and a phosphor layer 260a may be arranged the transparent resin 250 at an upper portion of the slot 512. The light emitting device 14a may also include a filter 280 on the phosphor layer 260a. The filter 280 may absorb light having a predetermined wavelength. In embodiments in which the light emitting devices 190 are UV light emitting devices, the filter 280 may be a UV filter. As shown in FIG. 14B, in embodiments, a transparent resin 250b may completely fill the slot 512 and a phosphor layer 260b may be arranged on the transparent resin 250b. The phosphor layer 260b may be a lens type structure having a predetermined curvature to improve a quality of light emission/extraction.

As shown in FIG. 14C, in embodiments, a transparent resin 250c may be formed only on the sub-mount 11, and a phosphor layer 260c may fill the slot 512.

Figure 15A:
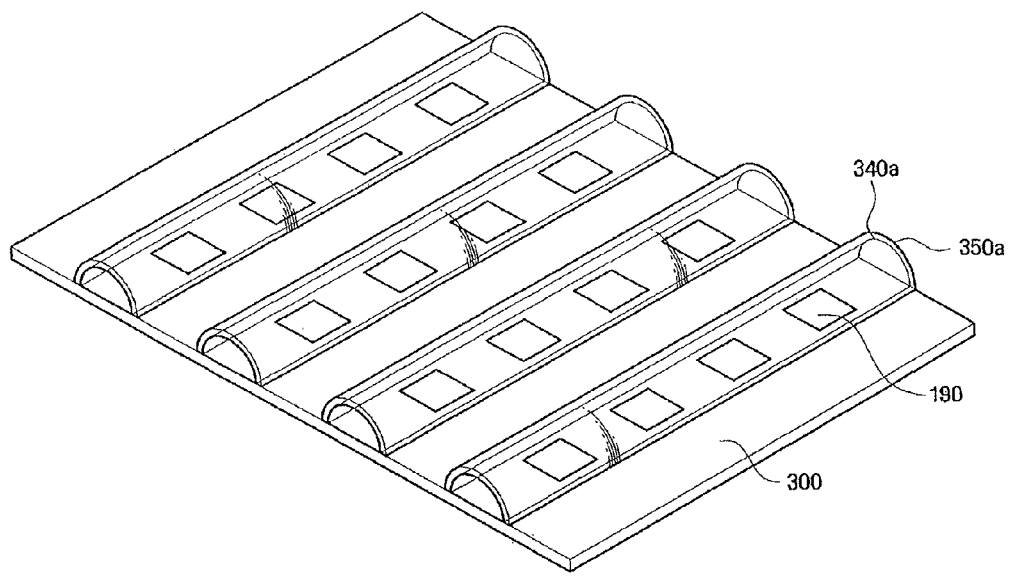
FIGS. 15A and 15B illustrate exemplary arrangements of phosphor on the circuit substrate of FIGS. 10A through 10C.
Figure 15B:
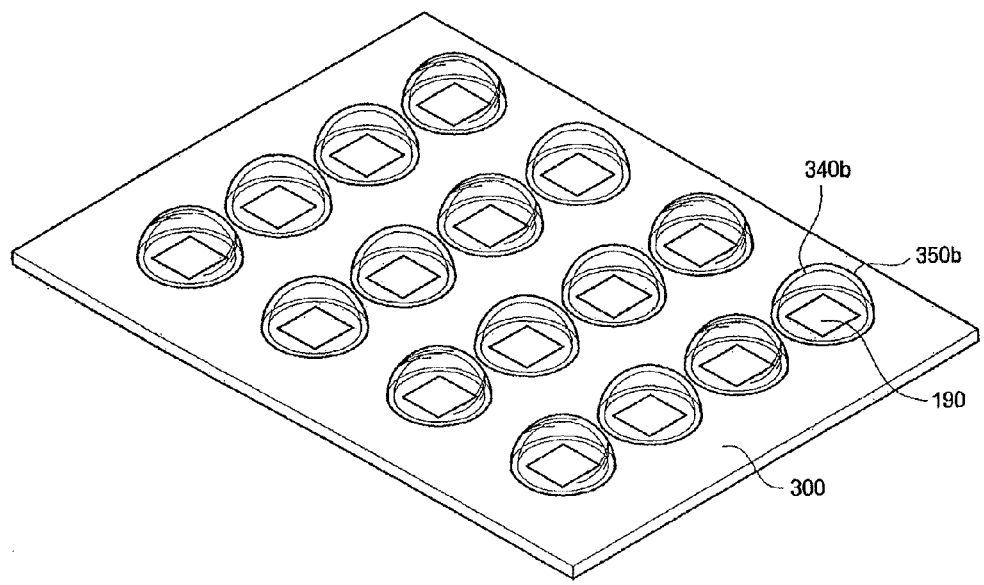

FIGS. 15A and 15B illustrate exemplary arrangements of a phosphor layer 340 on the circuit substrate 300 of FIGS. 10A through 10C. In embodiments, e.g., the phosphor layer 340 may include a transparent resin 350 including phosphor dispersed therein. FIG. 15A illustrates a line-type phosphor layer 340a and a line-type transparent resin layer 350a on the circuit substrate 300. FIG. 15B illustrates a dot-type phosphor layer 340b and a dot-type transparent resin layer 350b on the circuit substrate 300.

Figure 16A:
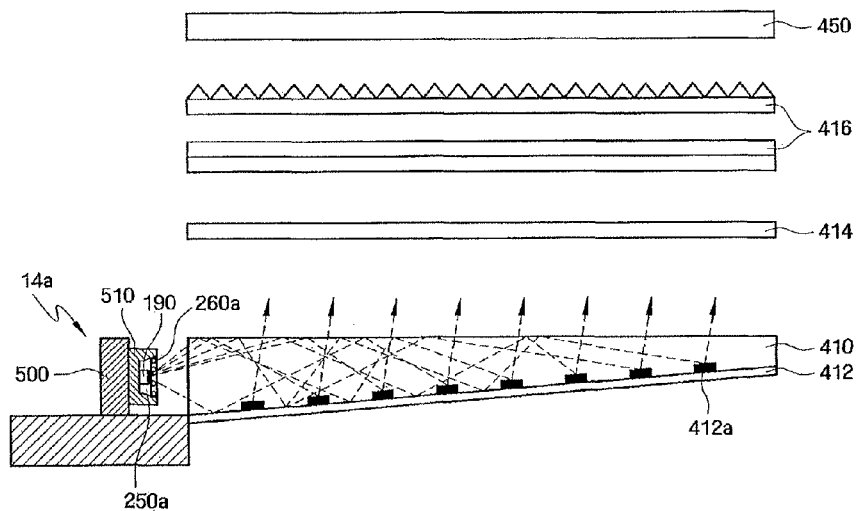
FIGS. 16A, 16B, 16C, 16D, and 16E illustrate exemplary illuminating devices employing a light emitting device according to one or more embodiments.
Figure 16B:
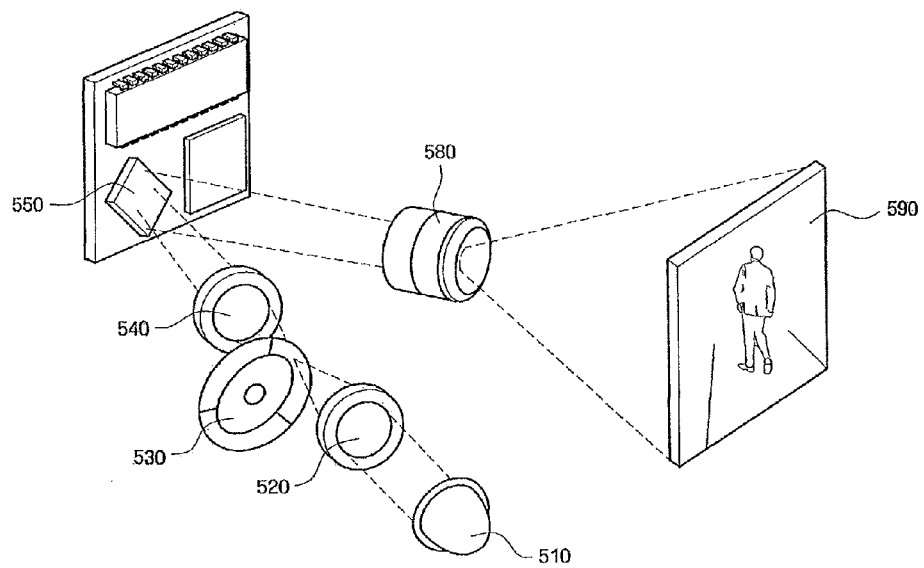
Figure 16C:
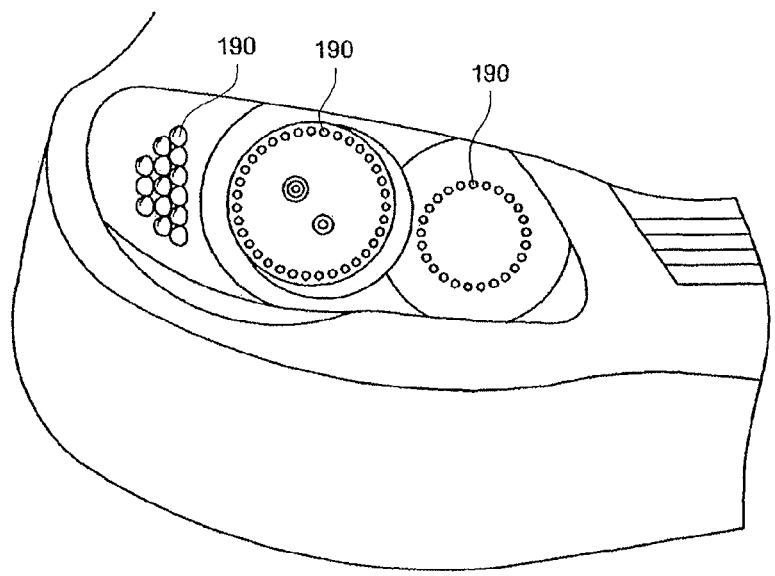
Figure 16D:
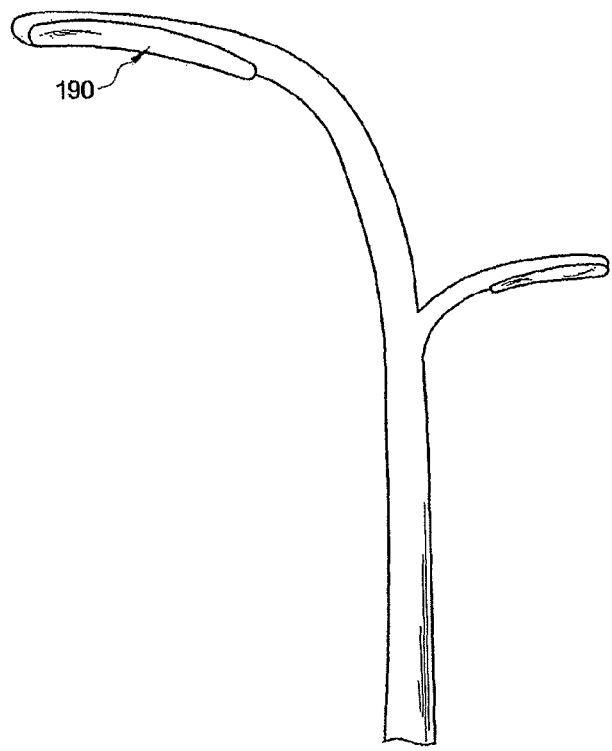
Figure 16E:
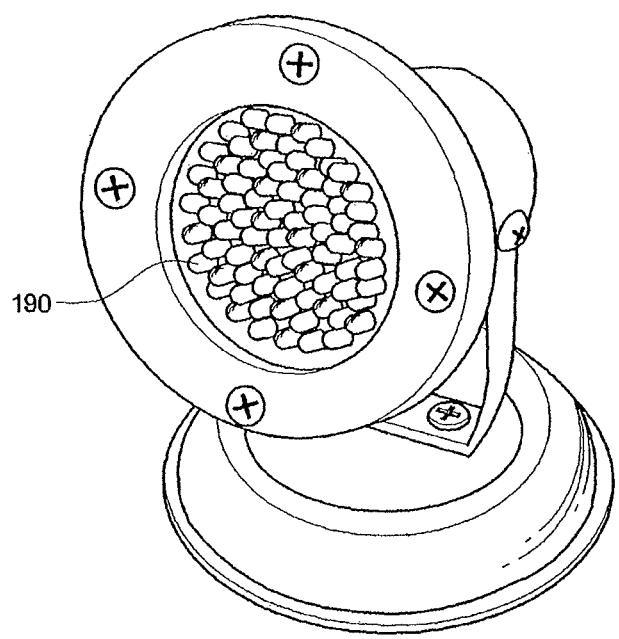

FIGS. 16A, 16B, 16C, 16D, and 16E illustrate various exemplary illuminating devices employing a light emitting device according to one or more aspects of the invention. For example, FIG. 16A illustrates a back light including the light emitting device 14a of FIG. 14A. The back light may include the light emitting device 14a of FIG. 14A, a reflective sheet 412, a pattern 412a, a spreading sheet 414, a prism sheet(s) 416 and a display panel 450. FIG. 16B illustrates a projector including a light source 510 that may include, e.g., the light emitting device 14c of FIG. 14C. the projector may further include a condensing lens 520, a color filter 530, a shaping lens 540, a digital micromirror device (DMD) 550, and a projection lens 580. FIG. 16C illustrates exemplary illuminating devices employing LEDs 190 arranged on sub-mount, e.g., sub-mount 11 of FIGS. 3A through 3E, the sub-mount 22 of FIG. 5, the circuit substrate 300 of FIG. 10A, and/or the power supply electrodes 310, 410 of FIGS. 12A, 12B. More particularly, FIGS. 16A, 16B, and 16C illustrate an automobile head lamp, a street lamp and an illumination light, respectively, which may each include one or more of the light emitting device(s), e.g., 17ac, 17dc of FIGS. 10B and 10C, respectively, to project light.

Further, although, e.g., sub-mount 11 of FIGS. 3A through 3E may be employed in the description of various exemplary applications and/or devices, it should be understood that a sub-mount according to any one or more of the aspects described above may be employed in the various exemplary applications and/or devices. That is, embodiments are not limited to those explicitly illustrated in the accompanying Figures.

It should be recognized that well known modifications can be made to configure the exemplary embodiments to become more suitable for use in a variety of applications. The modifications may include, for example, elimination of unnecessary components, addition of specialized devices or circuits, and/or integration of a plurality of devices.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A sub-mount comprising:
   a base substrate having a plurality of vias extending through the base substrate;
   a plurality of mounting portions formed on a first surface of the base substrate and on which at least one light emitting element is mounted, at least one mounting portion being electrically connected with more than one light emitting elements;
   wiring portions to connect respective mounting portions together;

a transparent resin layer formed on a phosphor layer on the at least one light emitting element and the mounting portions; and first and second electrode pads formed on a second surface of the base substrate and electrically connected to the mounting portions, wherein the plurality of mounting portions are arranged in a matrix pattern along a first direction and a second direction, wherein at least a portion of the wiring portions connect the plurality of mounting portions along a third direction formed at an acute angle with respect to each of the first direction and the second direction.

2. The sub-mount of claim 1, wherein the base substrate includes at least one of silicon (Si), strained Si, Si alloy, silicon-on-insulator (SOI), silicon carbide (SiC), silicon germanium (SiGe), silicon germanium carbide (SiGeC), germanium (Ge), Ge alloy, gallium arsenide (GaAs), indium arsenide (InAs), aluminum nitride (AlN), polymer, ceramic, plastic, a combination thereof, and a laminate thereof.

3. The sub-mount of claim 1, wherein the first and second electrode pads include at least one of copper (Cu), aluminum (Al), silver (Ag), gold (Au), tungsten (W), platinum (Pt), tin (Ti), zinc (Zn), nickel (Ni), a combination thereof, and a laminate thereof.

4. The sub-mount of claim 1, wherein the light emitting element is at least one of a UV light emitting device generating UV light and a blue light emitting device generating blue light that is light having a blue wavelength.

5. The sub-mount of claim 1, wherein the light emitting element is a flip chip type light emitting element.

6. The sub-mount of claim 1, wherein the phosphor layer is a material which absorbs light from the light emitting element and converts the light into light having a different wavelength, and includes at least one selected from the group consisting of a nitride-based or oxynitride-based phosphor, mainly activated by lanthanoids such as Eu and Ce.

7. The sub-mount of claim 1, wherein the phosphor layer is conformally formed on the light emitting element.

8. A sub-mount comprising:

a base substrate having a plurality of vias extending through the base substrate;

a mounting portion formed on a first surface of the base substrate and on which more than one light emitting elements are mounted;

wiring portions to connect respective mounting portions together;

a transparent resin layer formed on a phosphor layer on the light emitting elements and the mounting portion; and first and second electrode pads formed on a second surface of the base substrate and electrically connected to the mounting portion, the plurality of vias electrically connecting the light emitting elements to the first and second electrode pads, wherein the plurality of mounting portions are arranged in a matrix pattern along a first direction and a second direction, wherein at least a portion of the wiring portions connect the plurality of mounting portions along a third direction formed at an acute angle with respect to each of the first direction and the second direction.

9. The sub-mount of claim 8, further comprising conductive patterns on the first surface of the base substrate between the light emitting elements and the base substrate, the conductive patterns electrically connected to the light emitting elements and the base substrate, the plurality of vias electrically connecting the conductive patterns to the first and second electrode pads.

* * * * *